United States Patent [19]
Sieber et al.

[11] Patent Number: 6,071,989
[45] Date of Patent: Jun. 6, 2000

[54] PROCESS FOR PREPARING FINE PIGMENT DISPERSIONS

[75] Inventors: Werner Sieber, Fribourg; Véronique Hall-Goulle, Reinach, both of Switzerland

[73] Assignee: Ciba Specialty Chemicals Corporation, Tarrytown, N.Y.

[21] Appl. No.: 09/107,545

[22] Filed: Jun. 30, 1998

[30] Foreign Application Priority Data

Jun. 30, 1997 [CH] Switzerland ............................ 1573/97
Dec. 16, 1997 [CH] Switzerland ............................ 2896/97

[51] Int. Cl.[7] .............................. C08J 3/215; C08J 3/20; C09D 5/00
[52] U.S. Cl. .......................... 523/351; 523/160; 523/161; 528/480; 528/503; 106/31.6
[58] Field of Search .................................... 523/351, 160, 523/161; 528/480, 503

[56] References Cited

U.S. PATENT DOCUMENTS

| | | | |
|---|---|---|---|
| 2,886,600 | 5/1959 | Horsley et al. | 260/613 |
| 3,394,123 | 7/1968 | Ronco et al. | 260/203 |
| 3,637,545 | 1/1972 | Fivel | 260/4 |
| 4,508,880 | 4/1985 | Webster | 526/190 |
| 4,597,794 | 7/1986 | Ohta et al. | 106/20 |
| 5,030,669 | 7/1991 | Hendrickson et al. | 523/333 |
| 5,085,698 | 2/1992 | Ma et al. | 106/20 |
| 5,106,417 | 4/1992 | Hauser et al. | 106/20 |
| 5,106,533 | 4/1992 | Hendrickson et al. | 252/314 |
| 5,302,631 | 4/1994 | Yamada et al. | 523/160 |
| 5,484,943 | 1/1996 | Zambounis et al. | 548/453 |
| 5,486,550 | 1/1996 | Lubas | 523/160 |
| 5,561,232 | 10/1996 | Hao et al. | 546/14 |
| 5,615,725 | 4/1997 | Ming-Shun | 160/370.22 |
| 5,616,725 | 4/1997 | Zambounis et al. | 548/453 |
| 5,760,124 | 6/1998 | Listigovers et al. | 523/161 |
| 5,872,164 | 2/1999 | Koide et al. | 523/351 |

FOREIGN PATENT DOCUMENTS

| | | |
|---|---|---|
| 0 654 711 | 5/1995 | European Pat. Off. . |
| 0 784 085 | 7/1997 | European Pat. Off. . |
| 1055174 | 3/1986 | Japan . |
| 96/14925 | 5/1996 | WIPO . |

OTHER PUBLICATIONS

Twin Screw Extruders as Polymerization Reactors for a Free Radical Homo Polymerization, Ganzeveld and Jannssen, Canadian Journal of Chemical Engineering, vol. 71, Jun. 1993.

Colour Filters for LCDs, Tsuda, Displays, vol. 14, No. 2 (1993), pp. 115–f124.

Development of pigment–dispersed–type color filters for LCDs, Sugiura, Journal of the SID 1/3, (1993) pp. 341–346.

Photopolymers for LCD color filters, Nemoto et al., IDW'95, CF–3, pp. 57–60.

Pigmented Photoresists for Color Filters, Kudo et al., Journal of Photopolymer Science and Technology, vol. 9, No. 1 (1996), pp. 109–120.

Derw. Abst. JP 09132740.
Derw. Abst. JP 08327811.
Derw. Abst. JP 09176511.

*Primary Examiner*—Tae Yoon
*Attorney, Agent, or Firm*—David R. Crichton

[57] ABSTRACT

Preparation of pigment dispersions by
  a1) subjecting a mixture A comprising a latent pigment and a polymer to thermal, chemical or photolytic treatment and
  b) then adding a solvent, or
  a2) subjecting a mixture B comprising a latent pigment, a polymer and a solvent to thermal, chemical or photolytic treatment, new pigment dispersions and new latent pigments, their use in the process according to the invention for preparing the fine pigment dispersions and the use of the dispersions according to the invention for pigmenting high molecular mass material, including color filters.

2 Claims, No Drawings

PROCESS FOR PREPARING FINE PIGMENT DISPERSIONS

The present invention relates to pigment dispersions, to a process for preparing them, and to the pigment dispersions obtainable by this process and their use for pigmenting high molecular mass material.

Recent pigment applications are placing stringent requirements on the coloristic and processing properties of pigments. The pigments are required to possess clean, strong and bright shades to allow the opening-up of a large color area. Furthermore, they should be able to be used not only as an individual pigment but also as an element for combination in, say, trichromatic pigmentations. In terms of technical application it proves advantageous to apply the pigment as a dispersion, since it is then possible to avoid laborious mixing and milling operations which represent an additional hygiene burden. Moreover, the dispersions make the pigmentation process more reproducible, since there is a more homogeneous distribution of the pigment particles than in the powder form. On economic grounds it is particularly desirable to employ concentrated, stable dispersions which require little space on transportation or storage and at the same time possess good stability.

From U.S. Pat. Nos. 4,597,794 and 5,085,698 it is known to prepare fine pigment dispersions having an average particle size distribution of 0.015–0.5 micrometers, which are obtained with the addition of stabilizing copolymers by mechanical comminution and subsequent selection techniques, such as filtration or centrifuging, in order to remove coarse particles. A disadvantage of these processes is the extremely time-consuming and energy-intensive milling process, which may last for several days and requires high frictional energy. The milled product has a broad particle size distribution and rough surfaces owing to the mechanical stress. Excessively large pigment particles, or those with a roughened surface, lead to a loss of transparency. Smaller particles, on the other hand, tend to form aggregates which in the course of the dispersion process are broken up by known techniques, by means of high energy input in the form, for example, of ultrasound. One consequence of the propensity of smaller particles to aggregate is their flocculation tendency, and so these dispersions are inherently unstable.

The disadvantages described can be alleviated only in part by other techniques, such as evaporation methods (see U.S. Pat. Nos. 5,030,669 and 5,106,533) or the preparation of fine dispersions under high pressure (WO 96/14925). Moreover, these techniques require special apparatus for their application. The problem of providing pigments having the high transparency required, in particular, for the preparation of links from pigment dispersions, in order to achieve the correct coloring properties in accordance with the precise specifications, has still not been satisfactorily solved.

Compositions of polymers and laten pigments are known from EP-A 654,711, as are chemical, thermal or photolytic methods by means of which it is possible to generate pigment particles by known processses, in pre-structured layers consisting of polymers and solble pigment precursors.

In the test below, the use of the word polymer signifies polymer and/or copolymer.

The object of the present invention is therefore to provide pigment dispersions which possess high stability and good transparency, and a process for preparing them.

The present invention accordingly provides a process for preparing pigment dispersions comprising a pigment and a polymer, which comprises a1) subjecting a mixture A comprising a latent pigment and a polymer to thermal, chemical or photolytic treatment and
b) then adding a solvent, or
a2) subjecting a mixture B comprising a latent pigment, a polymer and a solvent to thermal, chemcial or photolytic treatment.

In general, the weight ratio of latent pigment to polymer in the mixtures A and B is chosen from the range from 1:1 to 1:20, preferably from 1:1.5 to 1:10 and, with particular preference, from 1:1.5 to 1:5.

By means of the thermal, chemical or photolytic treatment, which can be conducted in analogy to EP-A 654,711 or EP-A-742,255, the pigments are prepared from the soluble pigment precursors, the latent pigments.

Normally, the mixture A or B is treated thermally. In general, the mixture is heated within the temperature range from 100 to 200° C. for from one minute to 36 hours, with particular preference in the temrperature range from 120 to 150° C. for from 10 minutes to 24 hours.

In a preferred embodiment of the process of the invention, thermal treatment is conducted under pressure. In general, this pressure is chosen to be in the range from 70 kPa to 10 MPa, preferably from 90 kPa to 5 MPa; atmospheric pressure is particularly preferred.

The mixtures A and B can in general be prepared by generally known mixing methods, such as by stirring, kneading or fluidizing for form one minute to 36 hours, prefereably for from 10 minutes to 24 hours.

In a particular embodiment of the process of the invention, mixing and the thermal treatment of the mixture A are carried out in an extruder. Depending on the reactants employed, latent pigment or polymer, it may be appropriate to undertake prior mixing in accordance with generally known methods of mixing. The process steps in the extruder can be carried out continuously or batchwise. In general it is possible to use any kind of extruder, such as twin-screw extruders or kneading extruders; co-rotating twin-screw extruders are particularly preferred. Operation with an extruder is common knowledge and is described, for example, in "The Canadian Journal of Chemcial Engineering", 71, June 1993 and U.S. Pat. No. 3,637,545.

Therefore, a further embodiment of the process of the invention relates to preparation in an extruder, with the mixture A being subjected to thermal treatment in an extruder.

The ixtures A or B are preferably homogeneous mixtures. It is particularly preferred for the mixture B to be a solution, and with very particular preference a homogeneous solution in which the components are distributed uniformly. The term "homogeneous" here is restricted to "macroscopically uniform" and in this sense is the opposite of the term "heterogeneous", since homogeneous does not mean the same as "pure, unmixed", it is also possible for mixtures to be homogeneous, such as, for example, powders, salt solution, wine, milk chocolate (Römpp, 1997, p. 1795).

If desired, the mixture A can be prepared by mixing the latent pigment and the polymer with a solvent and then removing the solvent by generally known methods. Use is made in particular of solvents in which the latent pigmet and/or the polymer, with partiuclar preference both latent pigment and polymer, are present in dissolved form.

In general, the solvent-containing mixtures A or B are prepared from latent pigment and polymer by stirring, preferably intensive stirring.

In general, the mixtures comprising latent pigment, polymer and solvent are prepared by preparing separately two mixtures, one comprising latent pigment and solvent and one comprising polymer and solvent, and generally mixing them with one another for from one minute to 24 hours, preferably for from 10 minutes to 12 hours. An alternative option if desired is first to mix a latent pigment and polymer and then to add a solvent to this mixture.

In the present invention, the term solvent represents water-free organic and/or aqueous solvents, which may comprise organic solvents and/or solvent mixtures thereof.

Organic solvents or solvent mixtures commonly chosen are polar, aprotic solvents, such as aliphatic $C_1$–$C_4$alcohols, such as methanol, ethanol, 1- or 2-propanol, 1- or 2-isopropanol, n-butanol, sec-butanol, tert-butanol, and also polyols, Cellosolves and carbitols, such as ethylene glycol, diethylene glycol, triethylene glycol, glycerol, propylene gloycol [sic], diacetone alcohols, such as 4-hydroxy-4-methyl-2-pentanone, or ether alcohols, such as bis(2-hydroxyethyl) ether, bis(2-hydroxyproplyl) [sic] ether or bis(2-hydroxybutyl) ether, ethylene glycol monomethyl or monoethyl ether, propylene glycol methyl ether, dipropylene glycol methyl ether, tripropylene glycol methyl ether, ethylene glycol phenyl ether, ethylene glycol methyl ether, propylene glycol phenyl ether, diethylene glycol monomethyl or monoethyl ether, diethylene glycol monobutyl ether, triethylene glycol monomethyl or monoethyl ether, and also ethers such as, for example, dioxane, dimethyoxyethane or tetrahydrofuran, and also ketones, such as acetone, methyl ethyl ketone, 2-butanone, cyclohexanone, cyclopentanone, methyl isobutyl ketone or diacetone alcohol, for example, or chlorinated hydrocarbons, such as chloroform, trichloroethane or chlorobenzene, for example, and also N,N'-dimethylformamide or dimethyl sulfoxide or N-methyl-2-pyrrolidone, 2-pyrrolidone or N,N'-dimethylacetaminde, with particular preference dioxane or tetrahydrofuran and solvent mixtures of these.

The solvent is normally employed in a proportion of from 50 to 99.99% by weight, preferably from 80 to 99.99% by weight, based on the overall weight of latent pigment and polymer.

In accordance with the process of the invention, the thermal treatment of latent pigment and polymer can be carried out with or without solvent. An alternative option if desired is to concentrate the mixture B, preferably to 20% by weight of the overall mass of latent pigment and polymer. The solvent is commonly removed by generally known methods such as distillation, preferably under reduced pressure. If desired, the mixture A, which does not contain any solvent, can be dried prior to thermal treatment, preferably in the temperature range from 40 to 150° C. for from 1 to 24 hours and, with particular preference, in the temperature range from 40 to 80° C. for from 1 to 12 hours.

The thermally, chemically or photolytically treated mixture A, following its treatment, is provided with a water-free organic and/or aqueous solvent.

It is also possible if desired to add a solvent to the thermally, chemically or photolytically treated mixture B or to perform a solvent exchange. The solvent exchange can be carried out by commonly known methods such as distillative removal of the solvent, decanting or filtration and subsequent addition of the deirsed solvent.

Following the thermal, chemical or photolytic treatment the solvent is generally mixed by the customary methods of mixing, especially by stirring the components.

In another embodiment of the process of the invention it is also possible during the thermal treatment to prepare a dispersion comprising pigment, polymer and solvent directly from the mixture B, preferably from a homogeneous mixture B and, with partiuclar preference, from a solution comprising latent pigment, polymer and solvent.

In a preferred embodiment of the process of the invention, fine pigment dispersions are prepared by mixing a solution of latent pigment with a solution of polymer, concentrating the resulting reaction mixture by distilling off the solvents, prefereably to dryness, and subjecting the resulting concentrate to thermal treatment to prepare a mixture comprising pigment and polymer which is dispersed in aqueous and/or water-free ograinc solvents.

The present invention therefore also provides a process for preparing pigment dispersions which comprises c1) preparing a mixture comprising a latent pigment, a polymer and a solvent, c2) subsequently removing the solvent from the resulting mixture, and c3) then subjecting the solvent-free mixture A to thermal, chemical or photolytic treatment, and c4) then adding a solvent to the treated mixture.

In a further preferred embodiment, the present invention provides a process for preparing pigment dispersions from a pigment and a polymer which comprises subjecting a solution C comprising a latent pigment, a polymer and a solvent to thermal, chemcial or photolytic treatment.

A further preferred embodiment of the present invention provides, moreover, a process for preparing pigment dispersions which comprises g1) [lacuna] a solution C comprising a latent pigment, a polymer and a solvent, and g2) subsequently removing the solvent from the resulting solution, and g3) then subjecting the solvent-free mixture to thermal, chemical or photolytic treatment, and g4) then adding a solvent to the treated mixture.

In a further development of the process of the invention, pigment dispersions are provided by d1) preparing a mixture B comprising a latent pigment, a polymer and a solvent, and d2) subsequently removing some of the solvent from the resulting mixture, and d3) then subjecting the resulting mixture to thermal, chemical or photolytic treatment.

The process of the invention can be used to prepare water-free and aqueous pigment dispersions.

The present invention therefore provides, in a further preferred embodiment of the process of the invention, the preparation of water-free dispersions by e1) subjecting amixture A comrpising a latent pigment and a polymer to thermal, chemcial or photolytic treatment and e2) then adding a water-free solvent, or e3) subjecting a mixture B comprising a latent pigment, a polymer and a water-free solvent to thermal, chemcial or photlytic treatment.

Water-free solvents stand for organic solvents.

Furthermore, the present invention provides, in a further preferred embodiment of the process of the invention, the preparation of aqueous pigment dispersions by f1) subjecting a mixture A comprising a latent pigment and a polymer to thermal, chemical or photolytic treatment and f2) then adding an aqueous solvent, or f3) subjecting a mixture B comprising a latent pigment, a polymer and an aqueous solvent to thermal, chemical or photolytic treatment.

Aqueous solvents stand for water which may additionally include organic solvents and/or bases.

To prepare aqueous pigment dispersions the thermally, chemically or photolytically treated mixture is mixed with a water-containing solution, preferably a water-containing solution comprising a base.

If desired, before being mixed with a water-contianing solution, the thermally, chemically or photolytically treated mixture can be mixed with a water-miscible organic solvent, for example dioxane or tetrahydrofuran, which preferably dissolves the polymer.

In general, the aqueous pigment dispersions are adjusted to a pH $\geq 7$, with particular preference to a pH $\geq 8$. The pH can be adjusted by mixing the water-containing mixture comprising pigment, polymer and water with a base, or by mixing the thermally, chemically or photolytically treated mixture with a water-contianing solution comprising a base.

The bases present in the water-containing solutions are organic or inorganic bases.

If organic bases are used, they are preferably hydroxides of organic cations, for example trimethyl- or triethylammonium, or amines, for example mono-, di or trimethylamine, mono-, di- or triethylamine or mono-, di- or triethanolamine, mono-, di- or tripropanolamine, N,N'-dimethylaminoethanol, N,N'-methylathanolamine, or morphonline, N-methylmorpholine, piperidine or pyrrolidine; if inorganic bases, they are preferably lithium, sodium or potassium hydroxide. Particular preference is given to diemthylaminoethanol or morpoholine.

In a further preferred embodiment of the process of the invention, an aqueous pigment dispersion is prepared by a) mixing the thermally, chemically or photolytically treated mixture with an organic solvent, especially a water-miscible organic solvent, and b) then, by adding a water-containing solution comprising a base, especially an organic base, adjusting the pH to $\geq 7$.

In a preferred embodiment of the process of the invention for preparing aqueous pigment dispersions, the organic solvent is removed. In general, removal of solvent takes place by distillation, which is preferably carried out under reduced pressure.

If desired, the pigment dispersions of the ivnention may possess a residual fraction of latent pigment, based on pigment, of not more than 10% by weight, but preferably less than 5% by weight and, with very particular preference, less than 1% by weight.

The pigment dispersions of the invention possess a pigme concentration in the range from 0.01 to 10% by weight, prefereably from 0.1 to 5% by weight, based on the overall weight of the dispersion.

The fine pigment dispersions prepared by the process of the invention preferably possess an average particle size distribution of 0.015–0.5 micrometers, with particular preference 0.03–0.3 micrometers and, with very partiuclar preference, 0.05–0.2 micrometers. The particle size distriubiton was determined by the Joyce-Loebl disk centrifuging method.

If desired, the dipsersion of the invention may additionally comprise additives, such as surface-active compounds, which posses a preferred spatial orientation in solvents of different density. The aqueous dispersions, for example, comprise large molecules consisting of a hydrophilic head and a hydrophobic tail for exmaple Fluorad FC-170, a nonionic fluorine-contianing surfactant from 3M Inc. (or such as OLOA™ 1200 from Chevron Corp., Richfield. Calif. Amoco™ 9250, from Amoco Chemcial Co., Naperville, Ill.). The resulting dispersions preferably possess $\leq 20\%$ by weight, with particular preference $\leq 10\%$ by weight and, with very partiuclar preference, $\leq 5\%$ by weight of additives and may if desired include further co-solvents, examples being cyclohexanone, cyclopentanone, N,N'-dimethylformamide and dimethyl sulfoxide.

Polymers for aqueous pigment dispersions are preferably polymers consisting of a hydrophilic and hydrophobic part. The former can be ionizable, and form salts, or non-ionizable.

The polymers are prefereably random, block or graft polymers.

The hydrophillic part of the polymers is formed, for example, from monomers which in addition to functional groups such as alcohol, carboxyl, carboxamido, carboxylato or sulfo grops comprise sulfato, cyanato or carboxylic anhydride groups, or ether groups such as ethylene or propylene oxide groups, and in addition a polymerizable vinyl or vinylene radical, such as an acrylic or methylacrylic, crotyl, sulfoethylmethylacrylic, sulfopropylmethylacrylic, vinylnaphthyl, vinylphenyl or vinyltolyl radical, itaconyl radical, for example itaconyl monoesters, maleic acid or maleinyl radical, for example maleic monoesters, fumaryl radical, for example fumaryl monoesters, and especially vinylbenzoic acid. The monoesters are for example monoesters of itaconic, maleic or fumaric acid.

Preference is given to monomers which possess carboxyl, carboxylic anhydride, sulfonate or sulfate groups as functional groups. Particular preference is given to carboxyl ro carboxylic anhydride groups, for example vinylbenzoic acid or maleic anhydride.

Monomers which form the hydrophobic part of the polymers are preferably for example selected from the group of the apolar monomers consisting of styrene, styrene derivatives, such as $C_1$–$C_4$alkyl-substituted styrene, and vinyl chloride, vinylnaphthalene, vinylnaphthanlene derivatives, such as $C_1$–$C_4$-alkly-substituted vinylnaphthalene, vinyltoulene, $\alpha$-, m-, p- or m/p-vinyltoluene and aliphatic $C_{12}$–$C_{18}$alkenes.

Preferred hydrophobic apolar monomers are for example styrene, vinyltoluene and octadecene.

The copolymers chosen preferably have a narrow molar mass distribution of 1–2 Mw/Mn (where Mw is the mass average and Mn the number average). The molar mass (number average) of the copolymers is preferably <100 000 g/mol.

Copolymers which consist for example of styrene, vinyltoluene and vinylbenzoic acid monomers preferably possess a molar mass of 10 000–30 000 g/mol, with particular preference 12 000–20 000 g/mol and, with very partiuclar preference, 10 000–15 000 g/mol.

A further preferred embodiment of the invention provides copolymers which are prepared for example from styrene and maleic anhydride monomers and preferably posses a molar mass of 500–5000 g/mol, with particular preference 1000–3000 g/mol and, with very particular preference, 500–1500 g/mol.

For water-free pigment dispersions use is made for example of acrylate, methacrylate, styrene and vinyl polymers.

Particular preferred emobdiment of use is made of [sic] polyvinyl butyrate for ethanolic dispersions and of methyl methacrylate for dispersions with methyl ethyl ketone as solvent, or to copolymers of methyl methacrylate and butyl acrylate for pigment dispersions with chloroform as solvent.

Preferred polymers for aqueous pigment dispersion are composed for example of carboxyl-containing polymers, for example styrene, vinlyltoluene and vinylbenzoic acid, or vinylbenzoic acid and apolar monomers, and of styrene and maleic anhydride or of copolymer of long-chain alkenes ($C_{12}$–$C_{18}$) with maleic anhydride, for example styrene-maleic anhdyride, styrene-vinyltoluene-vinylbenzoic acid or octadecene-maleic anhydride.

A preferred embodiment of the process of the invention relates to the preparation of aqueous basic pigment dispersions from a latent pigment with a solution of a copolymer comprising vinylbenzoic acid and a non-polar monomer or with a solution comprising a carboxyl-containing polymer.

The polymers for aqueous or non-aqueous pigment dispersions are obtainable commercially, for example from the company Scientific Polymer Products Inc., or can be prepared by known methods as described, for example, in U.S. Pat. Nos. 4,597,764 or 4,508,880, or 5,085,698, or as indicated, for example, in Example 1 for the preparation of carboxyl-containing copolymers, by free-radical polymerization of the monomers in the presence of a free-radical initiator such as 4,4'-azobis(4-cyanopentanoic acid) and a free-radical transfer agent such as dodecylmercaptan.

The monomers and polymerization or copolymerizaton assistants, such as free-radical initiators or free-radical transfer agents, and also solvents, are commercial products and are obtianable, for example, from the company Fluka.

By latent pigments are meant soluble pigment precursors as descirbed, for example, in U.S. Pat. Nos. 5,616,725 and 5,561,232.

Preference is given to latent pigments of the formula I $$A(B)_x, \qquad (I),$$

in which x is a number form 1 to 8 where, if x is a number form 2 to 8 or hydrogen, with at least one of the radicals B not being hdyrogen, and [sic] the groups B can be identical or different, or form 1 to 7 of the groups B can be hydrogen, and A is the radical of a chromophore of the anthraquinone, azo, benzimidazolone, quinacridone, quinophthalone, diketopyrrolopyrrole, dioxazine, indanthrone, indigo, isoindoline, isoindolinone, perylene, and phthalocyanine series which is attached to x groups B via one or more heteroatoms from the group consisting of N, O and S, which form part of the radical A, and B is a radical selected from the group consisting of the formulae II–V

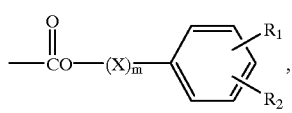
(II)

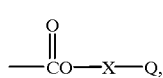
(III)

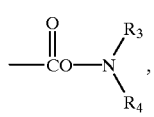
(IV)

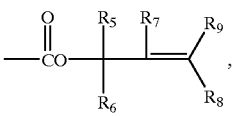
(Va)

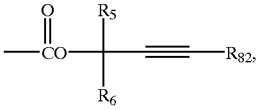
(Vb)

where in the formulae II, III, IV or Va or Vb m is zero or 1,

X is $C_2$–$C_5$alkenylene or $C_1$–$C_6$alkylene which is unsubstituted or substituted one or more times by $C_1$–$C_6$alkyl or $R_5$ and $R_6$, or $R_1$ and $R_2$ independently of one another are hydrogen, $C_1$–$C_6$alkyl, alkoxy, halogen, cyano, nitro, $N(C_1$–$C_6$alkyl$)_2$, unsubstituted or halogen-, cyano-, nitro-, $C_1$–$C_6$alkyl- or $C_1$–$C_6$alkoxy-substituted phenyl, and Q is hydrogen, $C_1$–$C_6$alkyl, CN, $CCl_3$, a group 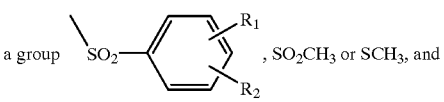, $SO_2CH_3$ or $SCH_3$, and $R_3$ and $R_4$ independently of one another are hydrogen, $C_1$–$C_4$alkyl or a group

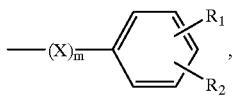, or $R_3$ and $R_4$ together form a piperidinyl radical, and $R_5$ and $R_6$ independently of one another are hydrogen, $C_1$–$C_{24}$alkyl, O-interrupted, S-interrupted or $C_1$–$C_6$alkyl-disubstituted and N-interrupted $C_1$–$C_{24}$alkyl, $C_3$–$C_{24}$alkenyl, $C_3$–$C_{24}$-alkynyl, $C_4$–$C_{12}$cycloalkyl, $C_4$–$C_{12}$cycloalkenyl, unsubstituted or $C_1$–$C_6$alkyl-, $C_1$–$C_6$alkoxy-, halogen-, cyano- or nitro-substituted phenyl or biphenyl, $R_7$, $R_8$ and $R_9$ independently of one another are hydrogen, $C_1$–$C_{24}$alkyl or $C_3$–$C_{24}$alkenyl, $R_{82}$ is hydrogen, $C_1$–$C_6$alkyl or a group of the formula

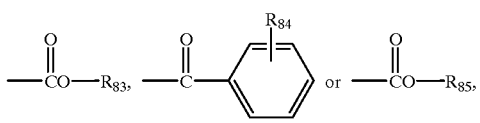

$R_{83}$ is $C_1$–$C_6$alkyl, $R_{84}$ is hydrogen or $C_1$–$C_6$alkyl and $R_{85}$ is hydrogen, $C_1$–$C_6$alkyl, unsubstituted or $C_1$–$C_6$alkyl-substituted phenyl, or B is a group of the formula

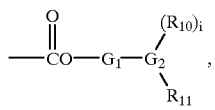

in which
G$_1$ is p,q-C$_2$–C$_{12}$alkylene which is unsubstituted or substituted one or more times by C$_1$–C$_{12}$alkyl, C$_1$–C$_{12}$alkoxy, C$_1$–C$_{12}$alkylthio or C$_2$–C$_{24}$dialkylamino, p and q being different positional numbers, G$_2$ is a heteroatom selected from the group consisting of N, O and S, and in which i, if G$_2$ is O or S, is the number 0 and, if G$_2$ is N, is the number 1, and R$_{10}$ and R$_{11}$ independenly of one another are [-(p',q'-C$_2$–C$_{12}$alkylene)-R$_{12}$-]$_{ii}$-C$_1$–C$_{12}$alkyl or C$_1$–C$_{12}$alkyl which is unsubstituted or substituted one or more times by C$_1$–C$_{12}$alkoxy, C$_1$–C$_{12}$alkylthio, C$_2$–C$_{24}$dialkylamino, C$_6$–C$_{12}$aryloxy, C$_6$–C$_{12}$arylthio, C$_7$–C$_{24}$alkylarylamino or C$_{12}$–C$_{24}$diarylamino, in which ii is a number from 1 to 1000, p' and q' are different positional numbers, each R$_{12}$ independently of the others is heteroatom O, S or C$_1$–C$_{12}$alkyl-substituted N, and C$_2$–C$_{12}$alkylene in the repeating units [C$_2$–C$_{12}$alkylene-R$_{12}$] can be identical or different, and R$_{10}$ and R$_{11}$ can be sautrated or mono- to decaunsaturated, can be uninterrupted or interrupted at any desired points by from 1 to 10 groups selected from the group consisting of —(C=O)— and —C$_6$H$_4$—, and may carry no or from 1 to 10 further substituents such as halogen, cyano or nitro, with the proviso that, if —G$_1$— is —(CH$_2$)$_{iv}$—, in which iv is a number from 2 to 12, and G$_2$ is S, R$_{11}$ is not unsubstituted, saturated and uninterrupted C$_1$–C$_4$alkyl.

Alkyl or alkylene can be straight-chain, branched, monocyclic or polycyclic.

Any C$_1$–C$_4$alkylene substituents comprise a straight-chain or branched alkylene, for example methylene, dimethylene, trimethylene, 1-methylmethylene, 1,1-dimethylmethylene, 1,1-dimethyldimethylene, 1-ethyldimethylene, 1-ethyl-1-methyl-dimethylene or tetramethylene.

A C$_1$–C$_6$alkylene radical X is a straight-chain or branched alkylene, for example methylene, dimethylene, trimethylene, 1-methylmethylene, 1,1-dimethylmethylene, 1-ethyldimethylene, 1-ethyl-1-methyldimethylene, tetramethylene, 1,1-dimethylethylene, 1,1-dimethylpropylene, 2,2-dimethylpopylene, 1-ethylpropylene, 2-ethylpropylene, 2-methylbutylene, pentamethylene, hexamethylene, 2,2-dimethylbutylene, 3,3-dimethylbutylene or 1-ethylbutylene or 2-ethylbutylene.

X as C$_2$–C$_5$alkenylene is straight-chain or branched alkenylene, for example vinyl, allyl, methallyl, 1-methyl-2-butenyl or 2-butenyl.

Any p,q-C$_2$–C$_4$alkylene substituents are for exalmple 1,2-ethylene, 1,2-propylene, 1,3-propylene, 1,2-butylene, 1,3-butylene, 2,3-butylene, 1,4-butylene or 2-methyl-1,2-propylene.

Any p,q-C$_5$–C$_{12}$alkenylene substituents are for example an isomer of pentylene, hexylene, octylene, decylene or dodecylene.

Any C$_1$–C$_4$alkyl substituents are for example methyl, ethyl, n-propyl, isopropyl, n-butyl, sec-butyl or tert-butyl, or cyclobutyl, C$_1$–C$_6$Alkyl can additionally be n-pentyl, 2-pentyl, 3-pentyl, 2,2-diemthylpropyl, cyclopentyl, cyclohexyl, n-hexyl or dimethylbutyl, and C$_1$–C$_{12}$-alkyl in addition for example n-octyl, 1,1,3,3-tetramethylbutyl, 2-ethylhexyl, nonyl, trimethylcyclohexyl, decyl, menthyl, thujyl, bornyl, 1-adamantyl, 2-adamantyl or dodecyl, and C$_1$–C$_{24}$alkyl furthermore tetradecyl, hexadecyl, octadecyl, eicosyl, heneicosyl, docosyl or tetracosyl.

If C$_2$–C$_{12}$alkyl is mono- or polyunsaturated it is C$_2$–C$_{12}$alkenyl, C$_2$–C$_{12}$alkynyl, C$_2$–C$_{12}$alkapolyenyl or C$_2$–C$_{12}$alkapolyvinyl, in which two or more double bonds may possibly be isolated or conugated, examples being vinyl, allyl, 2-propen-2-yl, 2-buten-1-yl, 3-buten-1-yl, 1,3-butadien-2-yl, 2-cyclobuten-1-yl, 2-penten-1-yl, 3-penten-1-yl, 2-methyl-1-buten-3-yl, 2-methyl-3-buten-2-yl, 3-methyl-2-buten-1-yl, 1,4-pentadien-3-yl, 2-cyclopenten-1-yl, 2-cyclohexen-1-yl, 3-cyclohexen-1-yl, 2,4-cyclohexadien-1-yl, 1-ρ-menthen-8-yl, 4(10)-thujen-10-yl, 2-norbomen-1-yl, 2,5-norbomadien-1-yl, 7,7-dimethyl-2,4-norcaradien-3-yl or the various isomers of hexenyl, octenyl, nonenyl, decenyl or dodecenyl.

C$_3$–C$_{24}$Alkenyl is C$_3$–C$_{24}$alkyl which is mono- or polyunsaturated, it being possible for two or more double bonds to be isolated or conjugated, examples being allyl, 2-propen-2-yl, 2-buten-1-yl, 3-buten-1-yl, 1,3-butadien-2-yl, 2-penten-1-yl, 3-penten-2-yl, 2-methyl-1-beuten-3-yl, 2-methyl-3-buten-2-yl, 3-methyl-2-buten-1-yl, 1,4-pentadien-3-yl, or the various isomers of hexenyl, octenyl, nonenyl, decenyl, dodecenyl, tetradecenyl, hexadecenyl, octadecenyl, eicosenyl, heneicosenyl, docosenyl, tetracosenyl, hexadienyl, octadienyl, nonadienyl, decadienyl, dodecadienyl, tetradecadienyl, hexadecadienyl, octadecadienyl, eicosadienyl, heneicosadienyl, docosadienyl or tetracosadienyl.

C$_{12}$–C$_{18}$Alkenes is [sic] for example do-, tri-, tetra-, penta-, hexa-, hepta- or octadecene.

C$_4$–C$_{12}$Cycloalkyl is for example a monocyclic cycloalkyl, such as cyclobutyl, cyclophentyl, cyclohexyl, trimethylcyclohexyl or menthyl, or a polycyclic cycloalkyl, such as thujyl, bornyl, 1-adamantyl or 2-adamantyl.

C$_4$–C$_{12}$Cycloalkenyl is C$_4$–C$_{12}$cycloalkyl which is mono- or polyunsturated,it being possible for two or more double bonds to be isolated or conjugated, examples being 2-cyclobuten-1-yl, 2-cyclopenten-1-yl, 2-cyclohexen-1-yl, 3-cyclohexen-1-yl, 2,4-cyclohexadien-1-yl, 1-ρ-menthen-8-yl, 4(10)-thujen-10-yl, 2-norbornen-1-yl, 2,5-norbornadien-1-yl or 7,7-dimethyl-2,4-norcaradien-3-yl.

C$_3$–C$_{24}$Alkynyl is C$_3$–C$_{24}$alkyl or C$_3$–C$_{24}$alkenyl which is doubly unsaturated one or more times, it being possible for the triple bonds to be isolated or conjugated with one another or with double bonds, examples being 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl or 1-tetracosyn-24-yl.

C$_1$–C$_6$Alkoxy is for example methoxy, ethoxy, n-propoxy, isopropoxy, n-butoxy, tert-butoxy, n-amyloxy, tert-amyloxy or n-hexyloxy.

C$_1$–C$_{12}$Alkoxy is —O—C$_1$–C$_{12}$alkyl, preferably —O—C$_1$–C$_4$alkyl.

C$_6$–C$_{12}$Aryloxy is —O—C$_6$–C$_{12}$aryl, for example phenoxy or naphthoxy, preferably phenoxy.

C$_1$–C$_{12}$Alkylthio is —S—C$_6$–C$_{12}$alkyl, preferably S-$_1$-C$_4$alkyl.

$C_6$–$C_{12}$Arylthio is —O—$C_6$–$C_{12}$aryl, for example phenylthio or naphthylthio, preferably phenylthio.

$C_2$–$C_{24}$Dialkylamino is N(alkyl$_1$)(alkyl$_2$), the sum of the carbon atoms in the two groups alkyl$_1$ and alkyl$_2$ being from 2 to 24, preferably N($C_1$–$C_4$alkyl)-$C_1$–$C_4$alkyl.

$C_7$–$C_{24}$Alkylarylamino is N(alkyl$_1$)(aryl$_2$), the sum of the carbon atoms in the two groups alkyl$_1$ and aryl$_2$ being from 7 to 24, examples being methylphenylamino, ethylnaphthylamino or butylphenanthrylamino, preferably methylphenylamino or ethylphenylamino.

$C_{12}$–$C_{24}$Diarylamino is N(aryl$_1$)(aryl$_2$), the sum of the carbon atoms in the two groups aryl$_1$ and aryl$_2$ being from 12 to 24, examples being diphenylamino or phenylnaphthylamino, preferably diphenylamino.

Halogen is for example fluorine, chlorine, bromine or iodine, preferably chlorine.

Of particular interest are latent pigments of the formula (I) in which x is a number from 1 to 8 and B is a group of the formulae

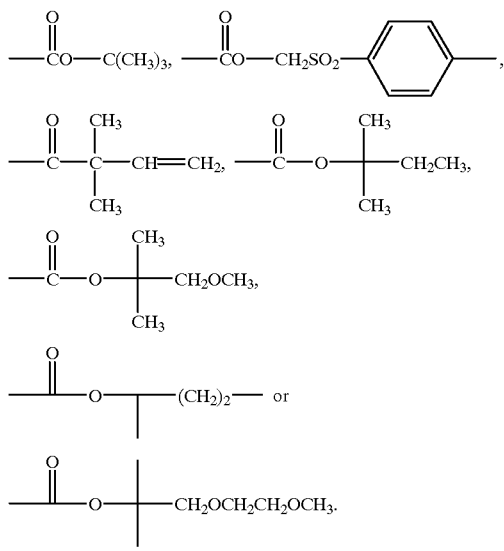

Preferred latent pigments are compounds of the formula (I), such as perylenecarboximides of the formulae VIa or VIb

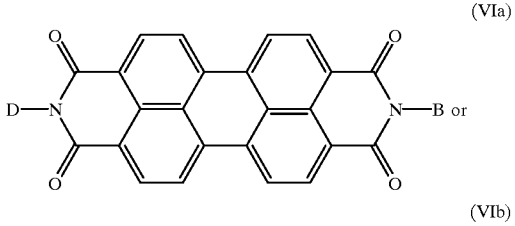

(VIa)

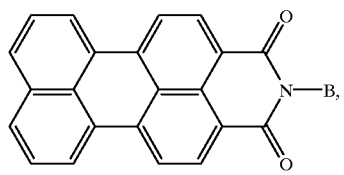

(VIb)

in which D is hydrogen, $C_1$–$C_6$alkyl, unsubstitued or halogen- or $C_1$–$C_6$alkyl-substituted phenyl, benzyl or phenethyl or is B, quinacidones of the formulae VII or VIIa

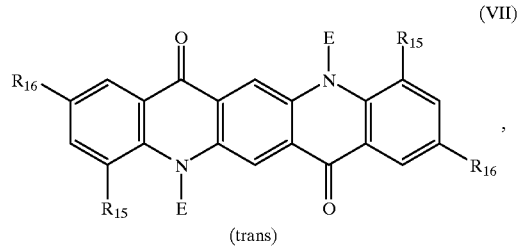

(VII)

(trans)

in which $R_{15}$ and $R_{16}$ independently of one another are hydrogen, halogen, $C_1$–$C_{24}$alkyl, $C_1$–$C_6$alkoxy or phenyl, or

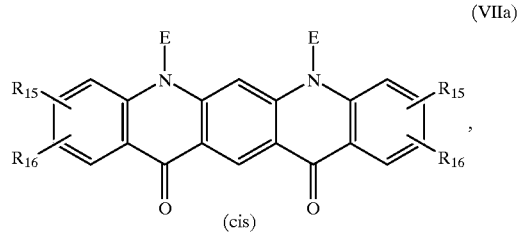

(VIIa)

(cis)

dihydroquinacidone of the fomrula VIIb

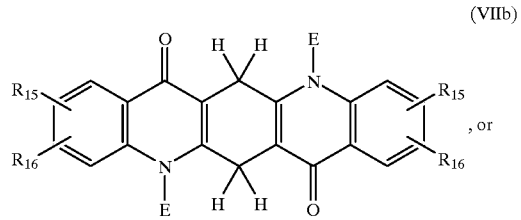

(VIIb)

, or quinacridonequinone of the formula VIIc

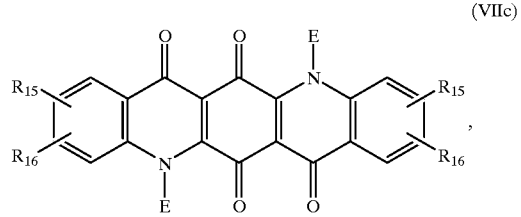

(VIIc)

or latent pigments of polycyclic chromophores of known parent structure, of the formulae VIId, VIIe or VIIf

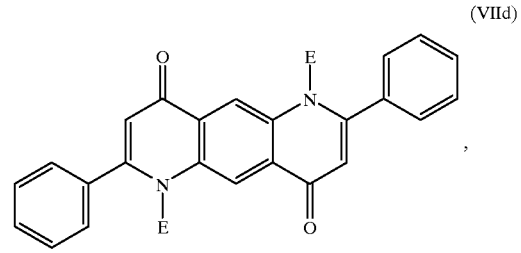

(VIId)

dioxazines of the formulae VIII or IX

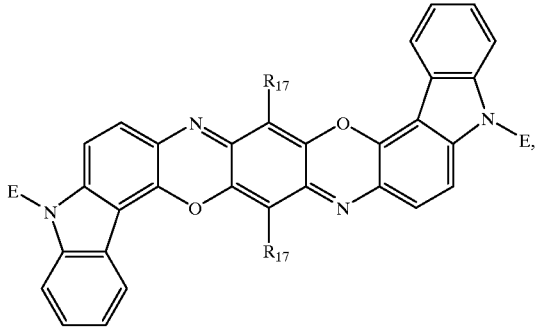
(VIII)

in which $R_{17}$ is hydrogen, halogen, or $C_1$–$C_{24}$alkyl, or

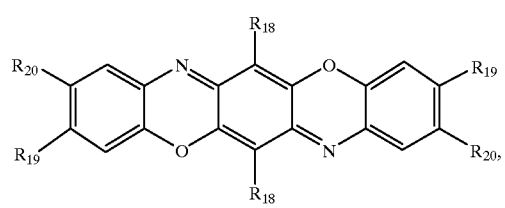
(IX)

in which $R_{18}$, $R_{19}$ and $R_{20}$ independently of one another are hydrogen, halogen, $C_1$–$C_4$alkyl, $C_1$–$C_4$alkoxy, NECOC$_1$–C$_4$alkyl, NECOphenyl or NH—E, at least one of the radicals $R_{18}$, $R_{19}$ or $R_{20}$ being NECOC$_1$–C$_4$alkyl, NECOphenyl or NH—E, isoindolines of the formulae X, XI or XII

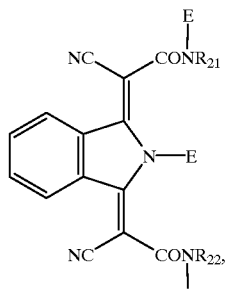
(X)

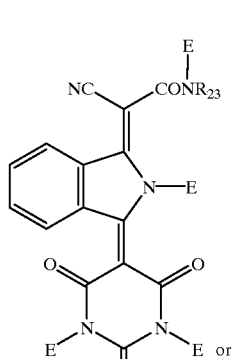
(XI)

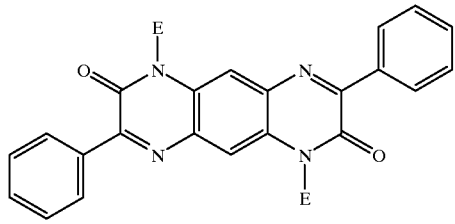
(VIIe)

or

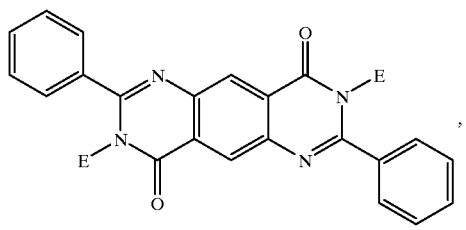
(VIIf)

quinophthalones of the formulae XL or XLI

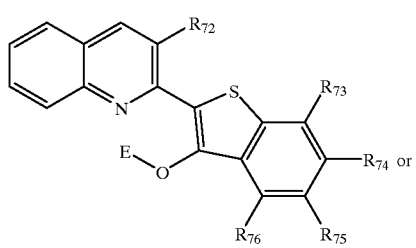
(XL)

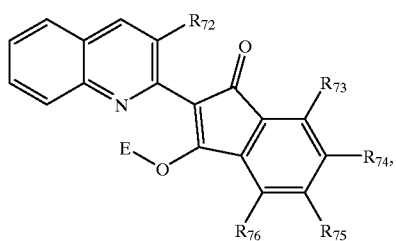
(XLI)

in which $R_{72}$ is hydrogen or O—E, $R_{73}$ to $R_{76}$ independently of one another are hydrogen, halogen, —COO-C$_1$–C$_5$alkyl or —CONE-C$_1$–C$_6$alkyl, -continued (XII)

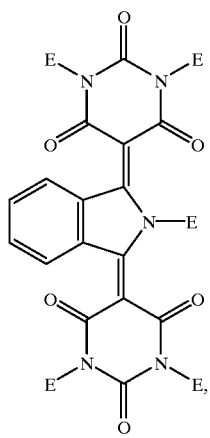

in which $R_{21}$ is a group

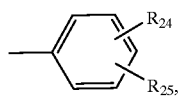

$R_{22}$ is hydrogen, $C_1-C_{24}$alkyl, benzyl or a group

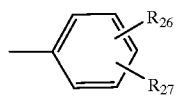

and $R_{23}$ is hydrogen, E or $R_{21}$, $R_{24}$, $R_{25}$, $R_{26}$ and $R_{27}$ independently of one another are hydrogen, $C_1-C_{24}$alkyl, $C_1-C_6$alkoxy, halogen or trifluoromethyl, isoindolinones of the formulae XIIIa, XIIIb or XIIIc (XIIIa)

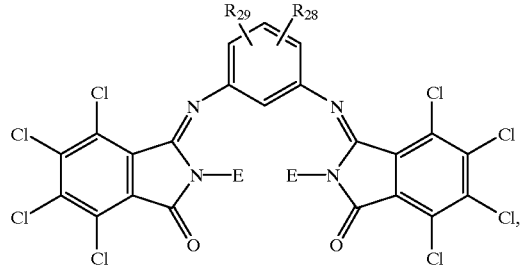

(XIIIb)

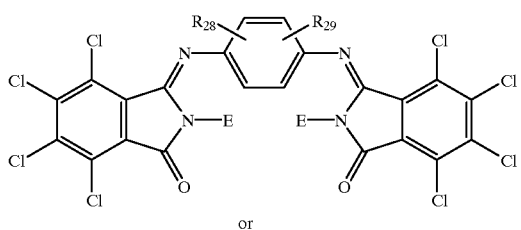

or

-continued (XIIIc)

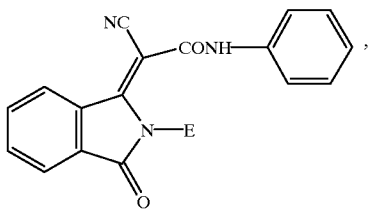

in which $R_{28}$ and $R_{29}$ independently of one another are hydrogen, halogen or $C_1-C_6$alkyl, or benzimidazoloneazo compounds of the formulae XIVa, XIVb or XIVc (XIVa)

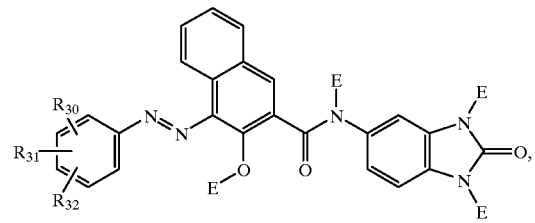

(XIVb)

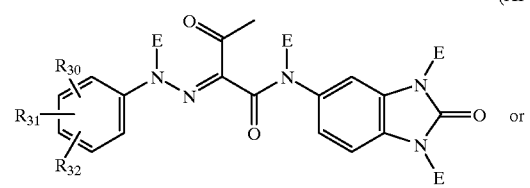

or (XIVc)

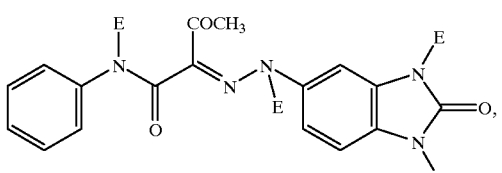

in which $R_{30}$, $R_{31}$ and $R_{32}$ independently of one another are hydrogen, halogen, $C_1-C_6$alkoxy, $C_1-C_6$alkyl, trifluoromethyl, nitro, acetyl, $CONR_7R_{33}$ or $SO_2NR_7R_{33}$, and $R_{33}$ is hydrogen, halogen or $C_1-C_6$alkyl or is phenyl which is unsubstituted or substituted by hydrogen or substituted one, two or three times by halogen, nitro, E, $CONER_{85}$, $NECO-R_{85}$, trifluoromethyl, $C_1-C_6$alkoxy or $C_1-C_6$alkyl, indigo derivatives of the formula XV

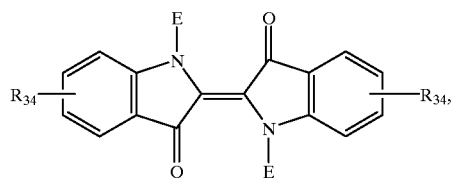
(XV)

in which
R$_{34}$ is hydrogen, CN, C$_1$–C$_6$alkyl, C$_1$–C$_6$alkoxy or halogen, monoazo compounds of the formulae XVIa, XVIb or XVIc

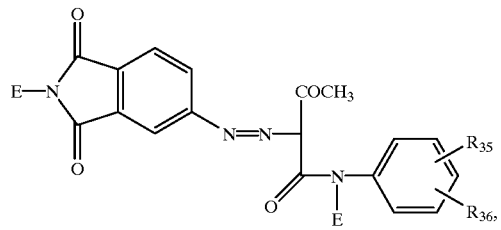
(XVIa)

in which
R$_{35}$ and R$_{36}$ independently of one another are hydrogen, halogen, C$_1$–C$_6$alkyl, C$_1$–C$_6$alkoxy, nitro, acetyl or SO$_2$NE-C$_1$–C$_6$alkyl,

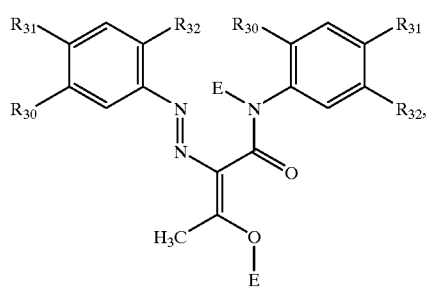
(XVIb)

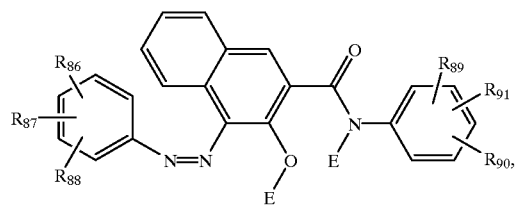
(XVIc)

in which
R$_{85}$ is the same as R$_{30}$ or is a radical, phenoxy or an ester, COO(C$_1$–C$_6$alkyl),
R$_{87}$ is the same as R$_{31}$ or is a radical, NECO-phenyl, NECO-C$_1$–C$_6$alkyl or CONH$_2$, R$_{88}$ is the same as R$_{32}$ or R$_{33}$ or is a radical, of the formula, SO$_2$O-aryl, SO$_2$O-aryl-NO$_2$, SO$_2$O-aryl-CO$_2$CH$_3$, or SO$_2$CH$_2$-aryl, in which, aryl is for example heteroaryl or for example phenyl, phenanthryl or naphthyl, or R$_{88}$ is a group

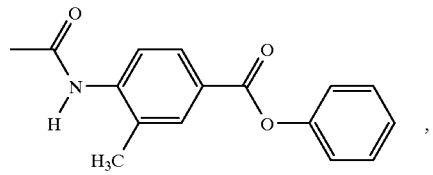

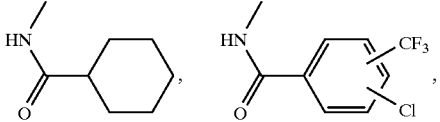

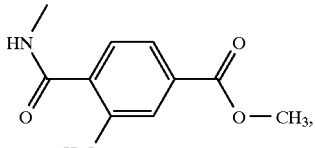

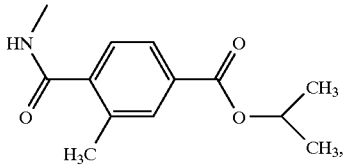

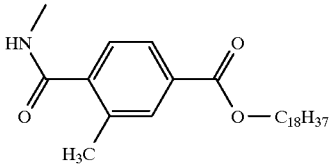

R$_{89}$ is hydrogen, C$_1$–C$_6$alkoxy, C$_1$–C$_6$alkyl or 1-naphthyl,
R$_{90}$ is hydrogen, C$_1$–C$_6$alkoxy, C$_1$–C$_6$alkyl, halogen or NECO-C$_1$–C$_6$alkyl or is unsubstituted phenacyl or phenacyl which is substituted by C$_1$–C$_6$alkyl or C$_1$–C$_6$alkoxy or is substituted one, two or three times by halogen, particular preference being given to single or twofold substitution by Cl, and also

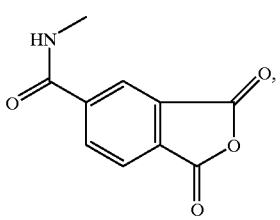

R$_{91}$ is hydrogen, halogen, C$_1$–C$_6$alkoxy, C$_1$–C$_6$alkyl, NO$_2$, or independently at each occurrence is as defined for R$_{87}$ and R$_{88}$, or is a group monoazo compounds of the formulae XVId or XVIe
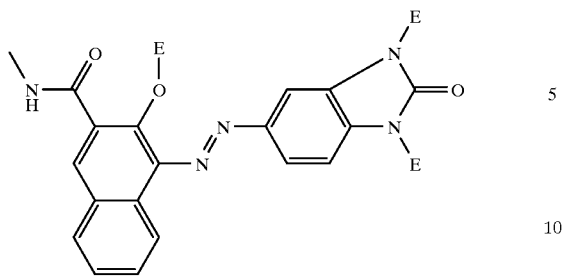
or
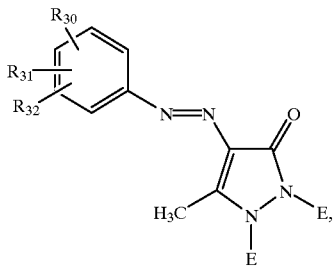
(XVId)
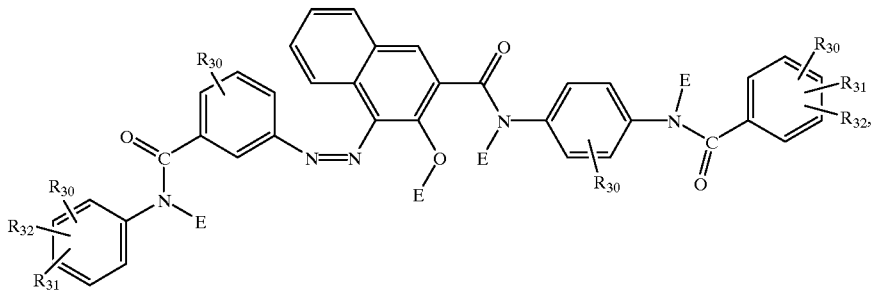
(XVIe)
disazo compounds of the formulae XVII, XVIII, XVIIIa, XVIIIb or XVIIIc
(XVII)
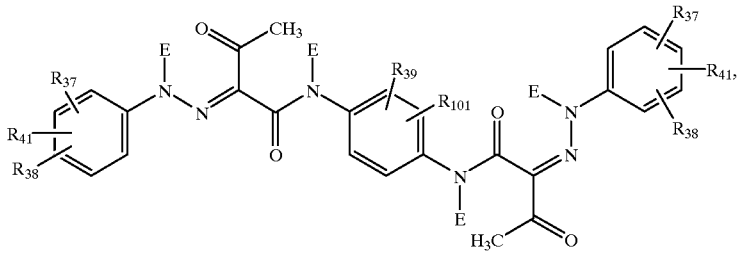
where, if E is hydrogen, XVII is a Color Index pigment P.Y. 93, P.Y. 94, P.Y. 95, P.Y. 128 or P.Y. 166,

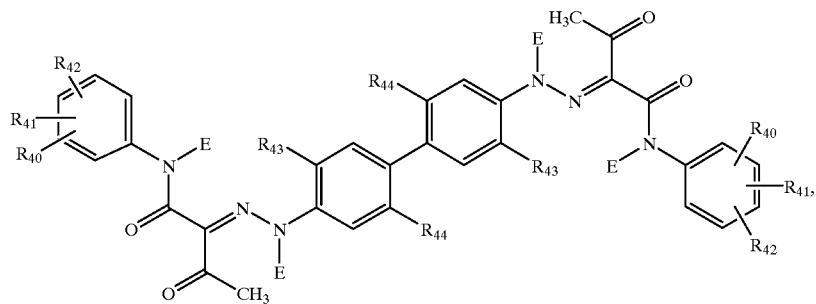
(XVIII)
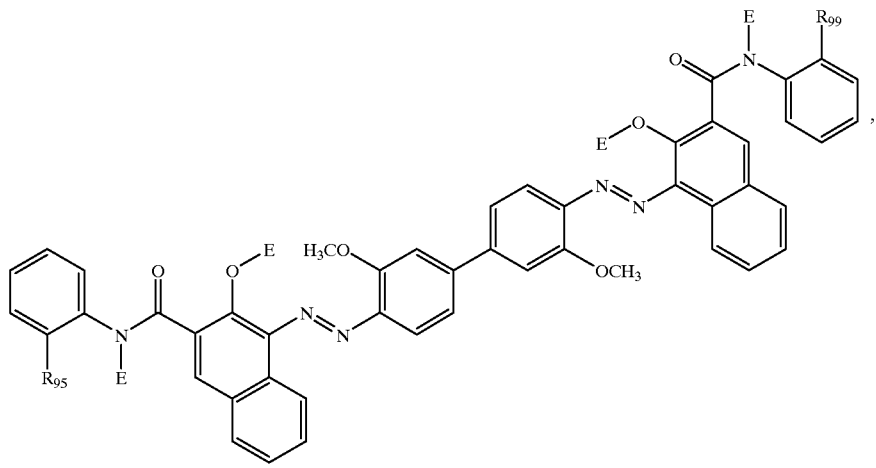
(XVIIIa)
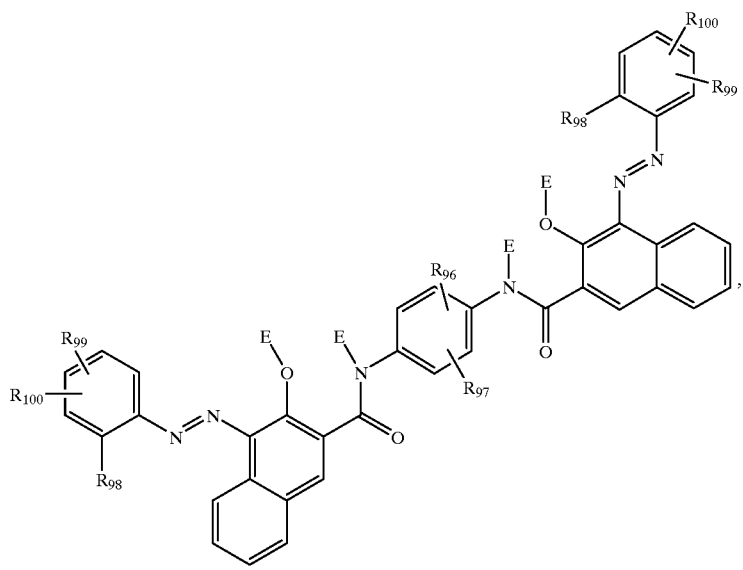
(XVIIIb)

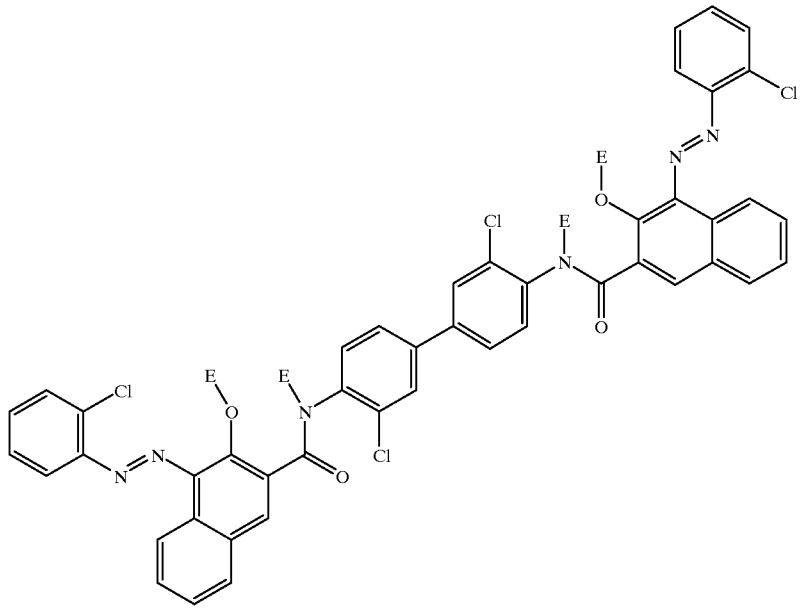
(XVIIIc)

where in XVIIIb, if E is hydrogen, XVIIIb is the Color Index pigment P.R. 144, P.R. 166, P.R. 214, P.R. 220, P.R. 221 or P.R. 242, and XVIIIc, if E is hydrogen, is the Color Index pigment P.O. 31, $R_{37}$ and $R_{38}$ independently of one another are hydrogen, halogen, nitro, $C_1$–$C_6$alkoxy, $C_1$–$C_6$alkyl, trifluoromethyl, $CONER_{45}$ or $SO_2NER_{45}$, but at least on one occasion are $CONER_{45}$ or $SO_2NER_{45}$, and $R_{39}$ and $R_{101}$ independently of one another are hydrogen, halogen, nitro, $C_1$–$C_6$alkoxy or $C_1$–$C_6$alkyl, $R_{40}$, $R_{41}$ and $R_{42}$ independently of one another are hydrogen, halogen, nitro, acetyl, $C_1$–$C_6$alkoxy, $C_1$–$C_6$alkyl, trifluoromethyl, $CONER_{45}$ or $SO_2NER_{45}$, but on at least one occasion are $CONER_{45}$ or $SO_2NER_{45}$, and $R_{43}$ and $R_{44}$ independently of one another are hydrogen, halogen, $C_1$–$C_6$alkoxy or $C_1$–$C_6$alkyl, and $R_{45}$ is hydrogen, halogen or $C_1$–$C_4$alkyl or is oxybisphenyl, biphenyl, naphthyl or phenyl each of which is unsubstituted or substituted by 1 to 3, preferably 2, substituents, for example halogen, nitro, trifluoromethyl, $C_1$–$C_4$alkoxy or $C_1$–$C_4$alkyl, E, preferably chlorine or methyl, $R_{95}$ is hydrogen or $OCH_3$, $R_{96}$ and $R_{97}$ independently of one another are chlorine or methyl, and $R_{98}$, $R_{99}$ or $R_{100}$ independently of one another are chlorine, methyl or $COOCH_2CH_2Cl$, $COOCH(CH_3)_2$, and also anthraquinonoid compounds of the formulae XIX, XIXa, XIXb, XIXc, XIXd, or XX

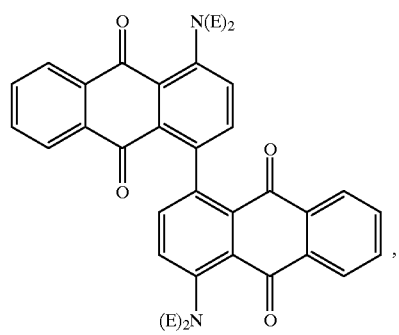
(XIX)

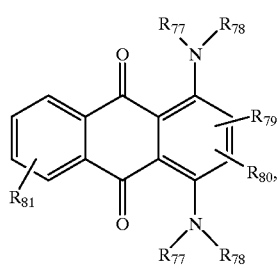
(XIXa)

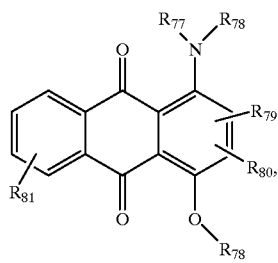
(XIXb)

in which $R_{77}$ and $R_{78}$ independently of one another are E, hydrogen or $C_1$–$C_{12}$alkyl or are $C_6$–$C_{12}$aryl, which is unsubstituted or substituted by halogen, $C_1$–$C_6$alkyl, $C_1$–$C_6$alkoxy, nitro, acetyl, $SO_2NEC_1$–$C_6$alkyl or $SO_2NH_2$, $R_{79}$ and $R_{80}$ independently of one another are hydrogen, halogen, $C_1$–$C_6$alkyl, $C_1$–$C_6$alkoxy, nitro, cyano, $CONH_2$, $SO_2NEC_1$–$C_6$alkyl, $SO_2NH_2$, $SO_3H$ or $SO_3Na$ or are $C_6$–$C_{12}$aryl which is unsubstituted or substituted by halogen, $C_1$–$C_6$alkyl, $C_1$–$C_6$alkoxy, nitro, acetyl $SO_2NEC_1$–$C_6$alkyl or $SO_2NH_2$, and $R_{81}$ is hydrogen, halogen, nitro, cyano, hydroxyl or $C_1$–$C_6$alkoxy, or

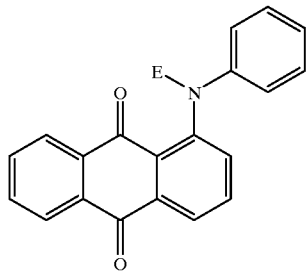

(XIXc)

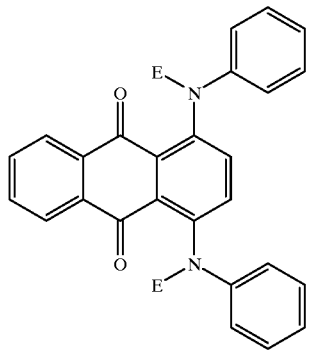

(XIXd)

$lp;1p$

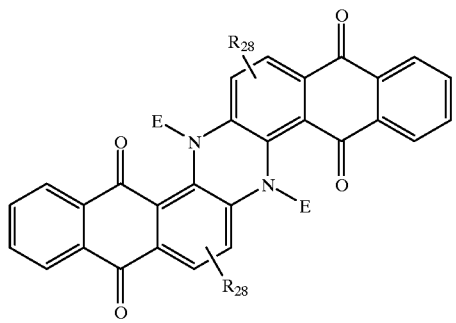

(XX)

phthalocyanines of the formula XXI

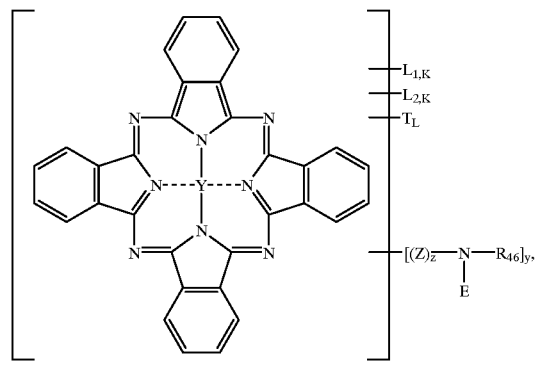

(XXI)

in which

Y is $H_2$, a divalent metal selected from the group Cu(II), Zn(II), Fe(II), Ni(II), Ru(II), Rh(II), Pd(II), Pt(II), Mn(II), Mg(II), Be(II), Ca(II), Ba(II), Cd(II), Hg(II), Sn(II), Co(II) or Pb(II), preferably Cu(II), Zn(II), Fe(II) Ni(II) or Pd(II) or a mono- or divalent oxo metal selected from the group V(O), Mn(O) or TiO, Z is —CH($R_{47}$)—, —CO— or —$SO_2$—, $R_{46}$ is hydrogen, $C_1$–$C_6$alkyl, —N(E)$R_{47}$, —NECOR$_{48}$, —$SO_2(NH)_2CO_2C(CH_3)_3$, —COR$_{48}$ or

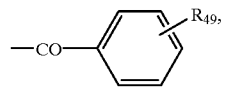

$R_{47}$ is hydrogen or $C_1$–$C_6$alkyl, $R_{48}$ is $C_1$–$C_6$alkyl and $R_{49}$ is hydrogen, halogen, $C_1$–$C_6$alkyl or $C_1$–$C_6$alkoxy, z is zero or 1, y is zero or is a number from 1 to 8, K is zero or 1, L is zero or a number from 1 to 16, where, is y is a number from 1 to 4, K and L are zero, or, if K and L are a number from 1 to 16, y is zero, and $L_1$ and $L_2$, each attached to one of the 8 nitrogen atoms forming the phthalocyanine complex and/or to one of the 8 carbon atoms forming the phthalocyanine complex, are independently of one another hydrogen, halogen, $C_1$–$C_{18}$alkoxy, $C_1$–$C_{18}$alkylthio, $C_1$–$C_{18}$alkylamino, $C_2$–$C_{18}$dialkylamino, morpholine or unsubstituted or $C_1$–$C_{12}$alkyl-substituted piperidine, and T, for each T independently of the others, is halogen, $C_1$–$C_{18}$alkyl, $C_1$–$C_{18}$alkoxy, $C_1$–$C_{18}$alkylthio or $C_2$–$C_{18}$dialkylamino, and pyrrolo[3,4-c]pyrroles of the formulae XXIIa or XXIIb

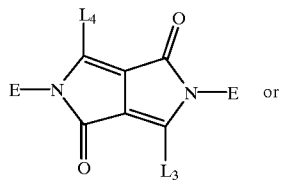

(XXIIa)

-continued (XXIIb)

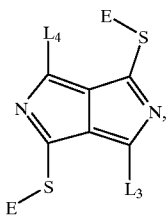

in which $L_4$ and $L_3$ independently of one another are a group of the formulae

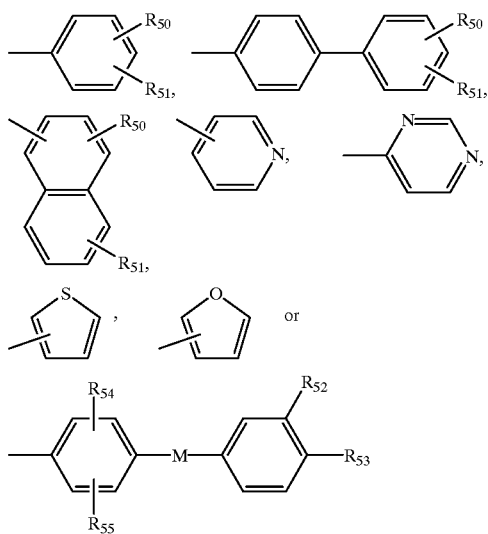

in which $R_{50}$ and $R_{51}$ independently of one another are hydrogen, halogen, $C_1$–$C_{24}$alkyl, $C_1$–$C_6$alkoxy, $C_1$–$C_{18}$alkylmercapto, $C_1$–$C_{18}$alkylamino, carbamoyl, —CN, —NO$_2$, phenyl, trifluoromethyl, $C_5$–$C_6$-cycloalkyl, —C=N—($C_1$–$C_{24}$alkyl,

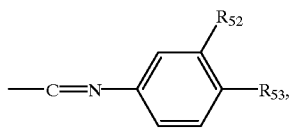

imidazolyl, pyrazolyl, triazolyl, piperazinyl, pyrrolyl, oxazolyl, benzoxazolyl, benzothiazolyl, benzimidazolyl, morpholinyl, piperidinyl or pyrrolidinyl, M is —CH$_2$—, —CH(CH$_3$)—, —C(CH$_3$)$_2$—, —CH=N—, —N=N—, —O—, —S—, —SO—, —SO$_2$— or —NR$_{56}$—, $R_{52}$ and $R_{53}$ independently of one another are hydrogen, halogen, $C_1$–$C_6$alkyl, $C_1$–$C_6$alkoxy or —CN, $R_{54}$ and $R_{55}$ independently of one another are hydrogen, halogen or $C_1$–$C_6$alkyl and $R_{56}$ is hydrogen or $C_1$–$C_6$alkyl, where in the abovementioned formulae E is in each case hydrogen or B with the proviso that E is B at least once in every formula, and the abovementioned preferences apply to B.

Particular preference is give to dioxazines of the formula IX, in which $R_{18}$, $R_{19}$ and $R_{20}$ independently of one another are $C_1$–$C_4$alkoxy, NECOC$_1$–$C_4$alkyl, NECOphenyl or NH—E, at least one of the radicals $R_{18}$, $R_{19}$ and $R_{20}$ being NH—E, or at least one of the radicals $R_{18}$, $R_{19}$ and $R_{20}$ is NECOphenyl and/or NECOC$_1$–$C_4$alkyl and/or $C_1$–$C_4$alkoxy, and isoindolines of the formula XII, and isoindolinones of the formula XIII, in which $R_{28}$ and $R_{29}$ independently of one another are hydrogen, halogen or $C_1$–$C_4$alkyl, and benzimidazoloneazo compounds of the formula (XXIII a)

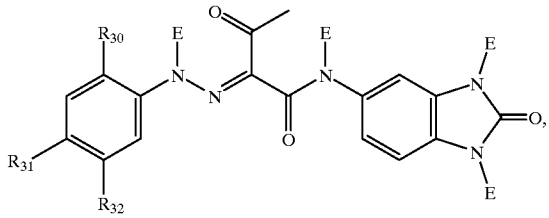

in which $R_{30}$, $R_{31}$ and $R_{32}$ independently of one another are hydrogen, halogen, $C_1$–$C_6$alkoxy, $C_1$–$C_6$alkyl, trifluoromethyl, CONER$_{33}$ or SO$_2$NER$_{33}$, and $R_{33}$ is hydrogen, halogen or $C_1$–$C_6$alkyl or is phenyl which is unsubstituted or substituted by hydrogen, halogen, nitro, E, $C_1$–$C_6$alkoxy or $C_1$–$C_6$alkyl, or (XXIII b)

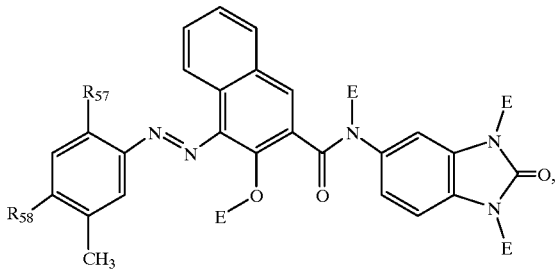

in which $R_{57}$ and $R_{58}$ independently of one another are hydrogen, halogen, $C_1$–$C_6$alkoxy, $C_1$–$C_6$alkyl, trifluoromethyl, CONER$_{60}$ or SO$_2$NER$_{60}$, and $R_{60}$ is hydrogen, halogen or $C_1$–$C_6$alkyl or is phenyl which is unsubstituted or substituted by hydrogen, halogen, nitro, E, $C_1$–$C_6$alkoxy or $C_1$–$C_6$alkyl, and monoazo compounds of the formula XVIf XVIfXVIfXVIf   [sic]

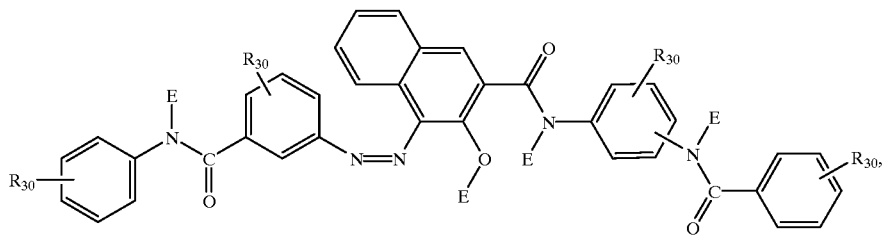

(XVIf)

disazo compounds of the formulae XXIV or XXV

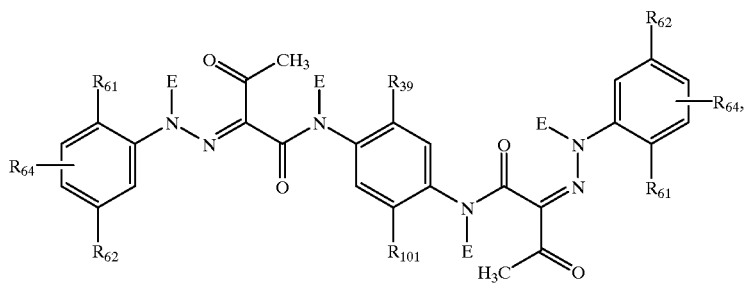

(XXIV)

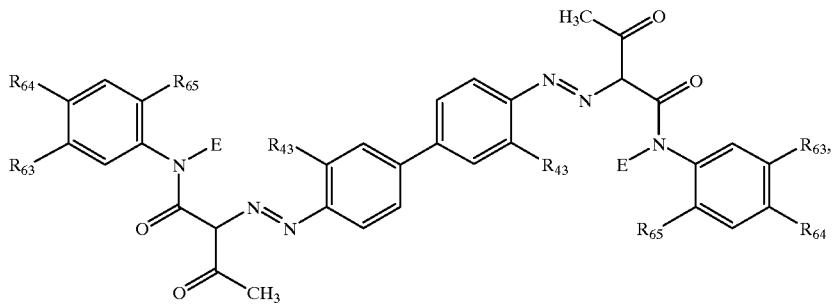

(XXV)

in which
- $R_{61}$ and $R_{62}$ independently of one another are hydrogen, chlorine, $CONER_{66}$ or $SO_2NER_{66}$, and are $CONER_{66}$ or $SO_2NER_{66}$ on at least one occasion,
- $R_{39}$ is hydrogen, chlorine or methyl,
- $R_{63}$, $R_{64}$ and $R_{65}$ independently of one another are hydrogen, chlorine, methoxy, methyl, or are $CONER_{66}$ or $SO_2NER_{66}$ on at least one occasion, and
- $R_{66}$ is oxybisphenyl or phenyl which is unsubstituted or substituted by 1 to 3 substituents selected from the group consisting of chlorine, trifluoromethyl, methoxy, methyl and E, and anthraquinonoid compounds of the formula XIX (a to d), and phthalocyanines of the formula XXI, in which M is $H_2$, a divalent metal selected from the group consisting of Cu(II), Zn(II), Fe(II) and Ni(II),
- Z is —CO— or —$SO_2$—, and
- z is zero or 1 and y is a number from 1 to 4,
- $L_1$ and $L_2$, each attached to one of the 8 nitrogen atoms forming the phthalocyanine complex and/or to one of the 8 carbon atoms forming the phthalocyanine complex, are independently of one another hydrogen, $C_2$-$C_{18}$dialkylamino, morpholine or unsubstituted or $C_1$-$C_{12}$alkyl-substituted piperidine, especially $C_1$-$C_{12}$alkyl-substituted piperidine and, very especially, 4-n-propylpiperidine, and pyrrolo[3,4-c]pyrroles of the formula XXII, in which $L_4$ and $L_3$ are identical and are a group of the formulae

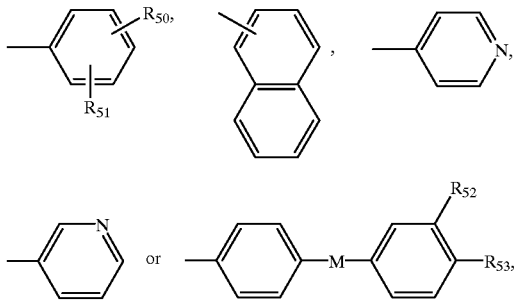

in which $R_{50}$ and $R_{51}$ independently of one another are hydrogen, halogen, $C_1$-$C_4$alkyl, $C_1$-$C_6$alkoxy, $C_1$-$C_6$alkylamino, carbamoyl, cyano, nitro, trifluoromethyl or phenyl, M is —O—, —$NR_{56}$—, —N=N— or —$SO_2$—, $R_{52}$ and $R_{53}$ are hydrogen and $R_{56}$ is hydrogen, methyl or ethyl, and where E in the formulae is in each case hydrogen or B, with the proviso that E is B at least once in each formula, and the abovementioned preferences apply to B.

Very particular preference is given to pyrrolopyrroles of the formula XXVIII

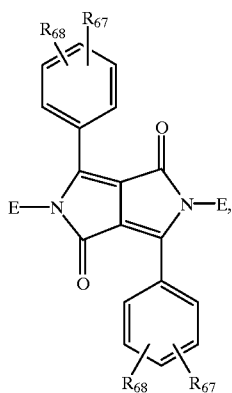

(XXVIII)

in which $R_{66}$ and $R_{67}$ independently of one another are hydrogen, methyl, tert-butyl, chlorine, bromine, cyano or phenyl, and E is hydrogen or B, with the proviso that E is B on at least one occasion, and B has the meaning of the last-indicated preference, and dioxazines of the formula IX in which $R_{18}$, $R_{19}$ and $R_{20}$ possess the meaning of the last-mentioned preference, and preferably $R_{18}$ is $C_1$–$C_4$alkoxy, $R_{19}$ is NECOphenyl or $R_{20}$ is NECO$C_1$–$C_4$alkyl, and isoindolines of the formulae XXIX, XXX or XXXI

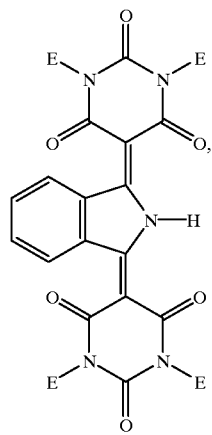

(XXIX)

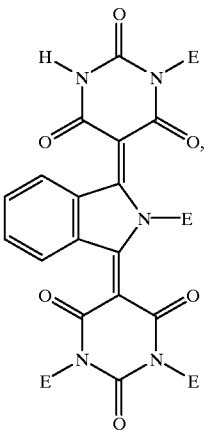

(XXX)

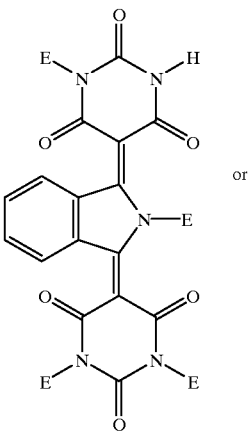

(XXXI)

or isoindolinone of the formula XXXII

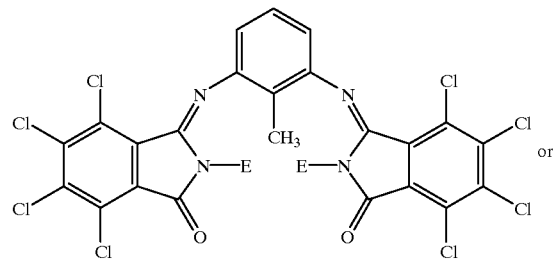

(XXXII)

or benzimidazolones of the formulae XXXIVa, XXXIVb, XXXIVc, XXXIVd, XXXVIII or XXXIVe

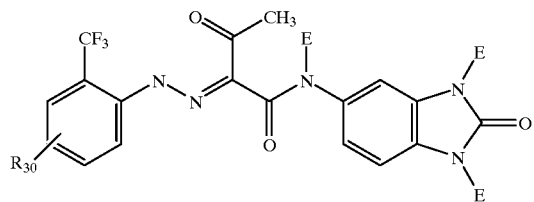
(XXXIV a)
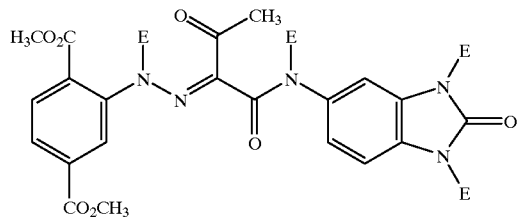
(XXXIV b)
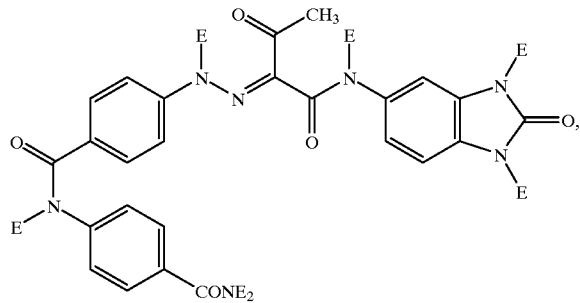
(XXXIV c)
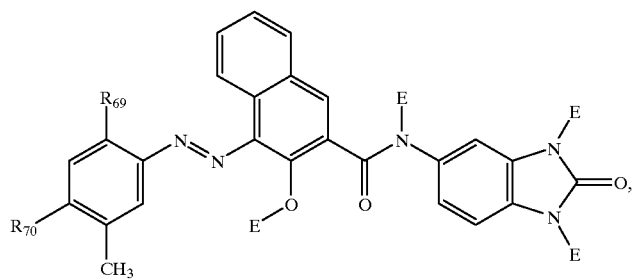
(XXXIV d)
especially
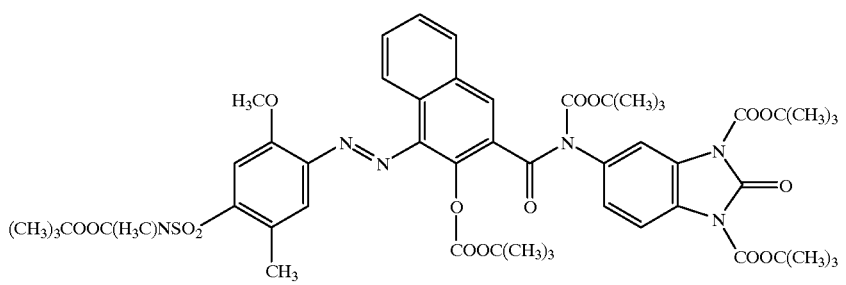
(XXXVIII)
and also

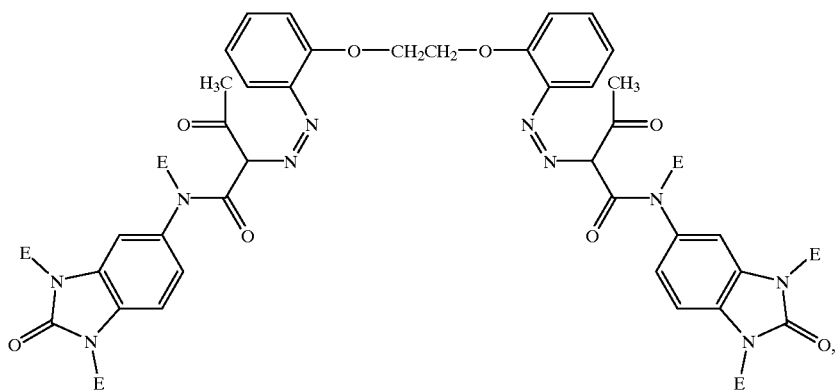
(XXXIV e)
in which
- $R_{30}$ is hydrogen, halogen, $C_1$–$C_6$alkoxy, $C_1$–$C_6$alkyl,
- $R_{69}$ is $C_1$–$C_6$alkoxy, especially methoxy, and
- $R_{70}$ is CONHE, $SO_2$NMeE or $SO_2$NHE, especially $SO_2$NHE or $SO_2$NMeE, and
azo compounds, such as mono- and disazo compounds of the formulae LX, LXI, XXXV, XXXVa, XXXVIa or XXXVIb
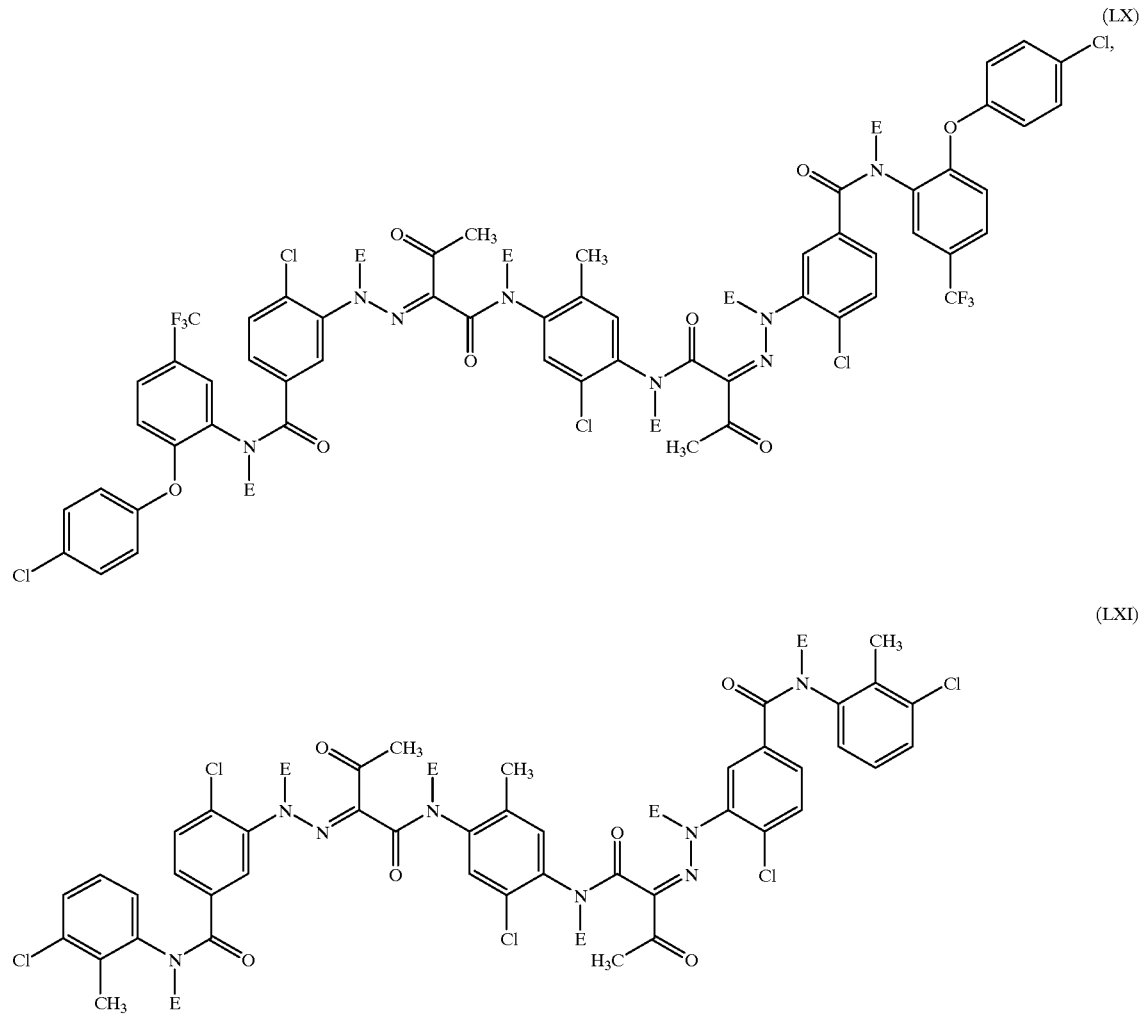

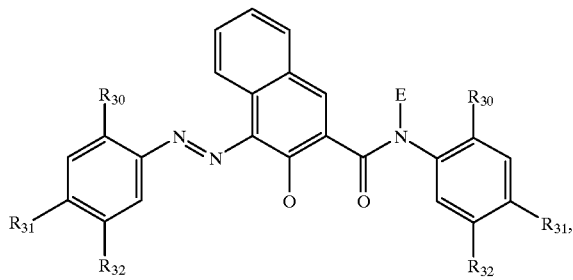

(XXXV)

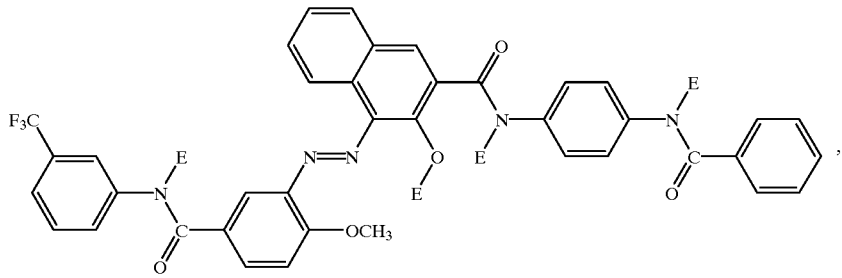

(XXXVa)

in which preferably E is —COO—C(CH$_3$)$_2$—CH$_2$CH$_3$ or —COO—C(CH$_3$)$_3$ and

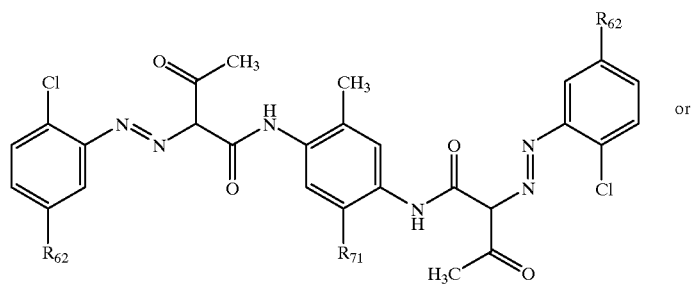

(XXXVI a)

or

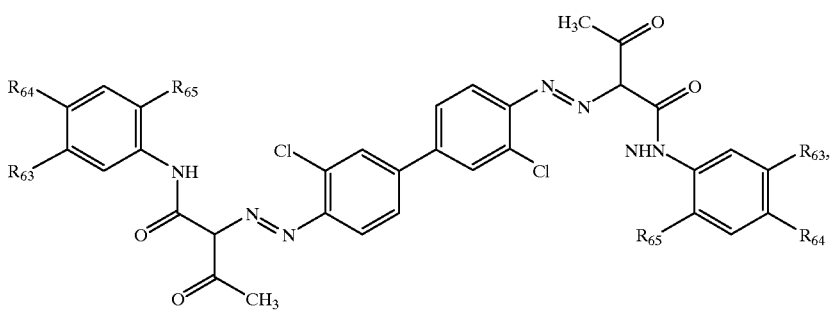

(XXXVI b)

in which
R$_{71}$ is chlorine or methyl and R$_{62}$, R$_{63}$, R$_{64}$ and R$_{65}$ are as defined above, and anthraquinonoid compounds of the formula XIX, and phthalocyanines of the formula XXI, with the last-mentioned preferences, in which E is hydrogen or B, with the proviso that E is B on at least one occasion, and B has the meaning of the last-indicated preference.

The compounds XXXIVc, XXXIVd and XXXVIIIa and also XXXVa are also new and are likewise provided by this invention, as are processes for preparing them by reacting a pigment of the formulae XXXIVc1, XXXIVd1 and XXXVa1

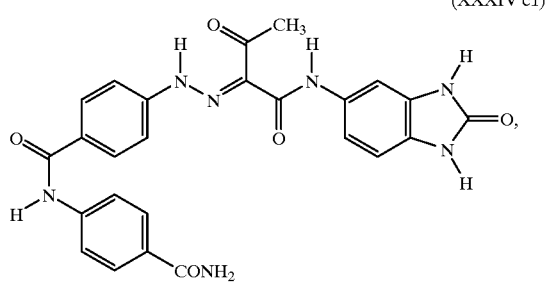
(XXXIV c1)

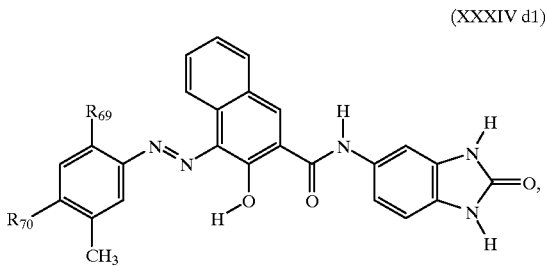
(XXXIV d1)

in which $R_{69}$ and $R_{70}$ correspond to the last-mentioned preferences, with the proviso that E is hydrogen, and

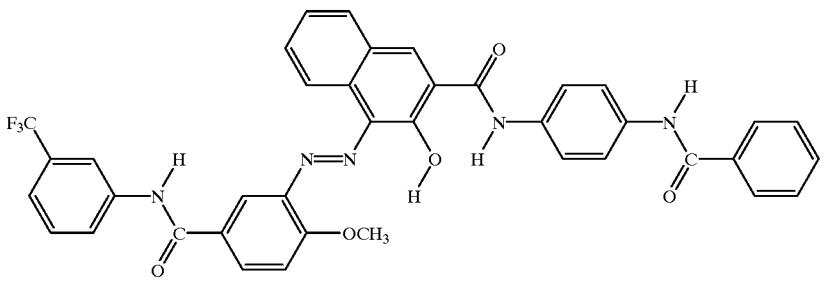
(XXXVa1)

with a compound of the formula Cl-B or B-O-B, in which B has the meaning of the last-indicated preference.

For example, compounds of the formulae XXXIVc, XXXIVd or XXXVa are prepared by general processes for preparing latent pigments, as described in U.S. Pat. Nos. 5,484,943 and 5,615,725 by reacting pigment of the formulae XXXIVc1, XXXIVd1 or XXXVa1 with a reactive compound of B, of the formulae Cl-B or B-O-B.

With particular preference, B here is di-tert-alkyl carbonate, for example di-tert-butyl or di-tert-amyl carbonate.

In general the reaction can be carried out in the presence of an organic solvent, preferably in aprotic solvents, for example tetrahydrofuran.

The reaction is normally conducted with addition of an organic base, examples being nitrogen-containing bases such as triethylamine, diethylaminopyridine and, preferably, dimethylaminopyridine.

Work up and/or purification and also isolation are generally carried out by the customary methods for the preparation of latent pigments, as described in U.S. Pat. Nos. 5,484,943 and 5,615,725, by filtering the reaction mixture and concentrating the filtrate which remains, preferably to dryness, and, if desired, purifying the crude product by filtration or chromatography. For the latter purification method it is preferred to use silica gel (for example obtainable commercially from FLUKA) and an organic solvent, for example a methylene chloride/ethyl acetate solvent mixture. The reaction product is normally isolated by concentrating the solution containing the purified product, preferably to dryness.

In a further embodiment of the process of the invention, use is made of the compounds of the formulae XXXIVc, XXXIVd or XXXVa for preparing the pigment dispersions of the invention.

The present invention additionally provides pigment dispersions comprising
(a) a polymer,
(b) an organic pigment and
(c) a water-free solvent or
(d) an aqueous solvent.

Water-free or aqeuous solvent and polymer correspond to the above-given definitions of the process of the invention. The pigment dispersions of the invention can be prepared in accordance with the process of the invention or can be prepared directly by generally known techniques of the prior art as described in U.S. Pat. Nos. 4,597,794, 5,085,698, 5,030,669 or WO 96/14925 from the pigments by mechanical comminution and subsequent selection techniques, such as filtration or centrifuging, to remove the coarse particles, with the addition of stabilizing copolymers.

Organic pigments of the pigment dispersions of the invention are compounds of the formula (LXII)

$$A(K)_x \quad \text{(LII)}$$

in which A and x are as defined in formula (I), and (K) is hydrogen or a cation of an alkali metal, such as $Li^+$, $Na^+$, $K^+$, of an alkaline earth metal, such as $Mg^{++}_{1/2}$, $Ca^{++}_{1/2}$, $Sr^{++}_{1/2}$, $Ba^{++}_{1/2}$, or $Cu^{30}$, $Cu^{++}_{1/2}$, $Zn^{++}_{1/2}$, $Al^{+++}_{1/3}$) or an organic nitrogen base such as $[NR_{85}R_{85'}R_{85''}R_{85'''}]^+$, in which $R_{85}R_{85'}R_{85''}R_{85'''}$ independently of one another [sic] are hydrogen, $C_1$–$C_6$alkyl, unsubstituted or $C_1$–$C_6$alkyl-substituted phenyl.

The pigment dispersions of the invention may comprise the organic pigments also colloidally embedded in the polymer and/or solvent and/or in dissolved form. The present invention therefore also provides the pigment dispersions of the invention which comprise a pigment in colloidal form.

Preferably, the present invention provides a pigment dispersion comprising
(a) a polymer,
(b) an organic pigment and
(c) an aqueous solvent.

The present invention also provides the pigment dispersions obtainable by the processes of the invention.

The pigment dispersions of the invention can if desired be used in further formulation or conditioning for specific applications.

Consequently, the present invention also provides for the use of the pigment dispersions of the invention and of the compounds XXXIVc, XXXIVd or XXXVa, or of the pigmentary form obtainable from these compounds, for dyeing/pigmenting high molecular mass material, which may be organic or inorganic in nature and may denote plastics and/or natural substances. The compounds XXXIVc, XXXIVd or XXXVa can if desired be converted into the pigmentary form by generally known methods such as by thermal, chemical or photolytic treatment, as described for example in EP-A 654 711 or EP-A-742255. The high molecular mass materials can for example comprise natural resins or dry [sic] oils, rubber or casein, or modified natural substances, such as chlorinated rubber, oil-modified alkyd resins, viscose, cellulose ethers or cellulose esters, such as ethylcellulose, cellulose acetate, propionate or butyrate, celulose actobutyrate [sic] and also nitrocellulose, but in particular can comprise fully synthetic organic polymers (thermosets and thermoplastics), can be obtained by polymerization, for example by polycondensation or polyaddition. The class of the polymers includes, for example, polyolefins, such as polyethylene, polypropylene, polyisobutylene, and also substituted polyolefins, such as polymers of monomers such as vinyl chloride, vinyl acetate, styrene, acrylonitrile, acrylates, methacrylates, fluoropolymers, such as for example polyfluoroethylene, polytrifluorochloroethylene or tetrafluoroethylene/hexafluoropropylene copolymer, and also copolymers of the monomers mentioned, especially ABS (acrylonitrile/butadiene/styrene) or EVA (ethylene/vinyl acetate). From the series of the polyaddition and polycondensation resins the materials concerned are for example condensation products of formaldehyde with phenols, the so-called phenoplases [sic], and condensation products of formaldehyde with urea, thiourea, and also melamine, the so-called aminoplasts, and also the polyesters which are used as coating resins, including both saturated resins, such as alkyd resins, for example, and unsaturated resins, such as maleic resins, for example, and also the linear polyesters, polyamides, polyurethanes, polycarbonates, polyphenylene oxides or silicones, silicone resins.

The high molecular mass compounds mentioned can be present individually or in mixtures as plastic masses, melts or in the form of spinning solutions, coating materials or printing inks. Depending on the intended use it is found advantageous to employ the disperse pigment concentrates of the invention as toners or in the form of preparations.

The present invention therefore preferably provides for the use of the pigment dispersions of the invention and of a compounds [sic] XXXIVc, XXXIVd or XXXVa or of the pigmentary form obtainable from these compounds or of the compositions of the invention comprising high molecular mass material, especially high molecular mass organic material, and a colористically effective amount of the compounds of the formulae XXXIVc, XXXIVd or XXXVa, or of the pigmentary form obtainable from these compounds, or of the pigment dispersions of the invention, for the preparation of inks or printing inks in printing processes for flexographic printing, screen printing, packaging printing, security ink printing, intaglio printing or offset printing, for pre-press stages and for textile printing, for office, home or graphics applications, for paper goods, for ballpoint pens, felt tips, fiber tips, card, wood, (wood) stains, metal, inking pads or inks for impact printing (with impact-pressure ink ribbons), or for the preparation of colorants for coating materials, for industrial or commercial use, for textile decoration and industrial marking, for roller coatings or powder coatings or for automotive finishes for high-solids, (low-solvent), water-containing or metallic coating materials or for water-containing formulations, water-containing paints, or for the preparation of to pigment [sic] of plastics for coatings, fibers, platters or mold carriers, or for non-impact printing material, for digital printing, for thermal wax transfer printing, for inkjet printing of for thermal transfer printing, or for the preparation of color filters, especially for visible light in the range from 400 to 700 nm, which can be used for the production of liquid crystal displays (LCDs) or charge combined [sic] devices (CCDs) or for the preparation of cosmetics, of for the preparation for [sic] toners or of polymeric ink particles for the preparation of toners for dry copy toners and liquid copy toners, or electrophotographic toners.

The toners can be prepared in masterbatches and can be used in turn in masterbatches for the preparation of colored plastics.

The invention additionally provides compositions comprising high molecular mass material, especially high molecular mass organic material, a colористically effective amount of the compounds of the formulae XXXIVc, XXXIVd or XXXVa, or of the pigmentary form obtainable from these compounds, or of the pigment dispersions of the invention.

For the pigmentation of the high molecular mass organic substances with the compounds obtained in accordance with the invention takes place [sic], for example, such that such a compound is admixed to these substrates, the compound optionally being in the form of masterbatches, using roll mills or mixing or milling apparatus. The pigmented material is subsequently brought into the desired final form by techniques known per se, such as calendering, compression molding, extrusion, spreading, pouring or injection molding. It is often desirable, in order to prepare non-rigid moldings or to reduce their brittleness, to incorporate so-called plasticizers into the high molecular mass organic compounds prior to forming. Compounds which can be used as such plasticizers are for example esters of phosphoric acid, phthalic acid or sebacic acid. The plasticizers can be incorporated into the polymers before or after the incorporation of the compounds obtained in accordance with the invention. It is also possible, in order to obtain different shades, to add fillers or other color-imparting constituents, such as white, colored or black pigments, in any desired amounts to the high molecular mass organic substances in addition to the compounds obtained in accordance with the invention.

For pigmenting lacquers, coating materials and printing inks, the high molecular mass organic materials and the pigment dispersions obtained in accordance with the invention, alone or together with additives such as fillers, other pigments, siccatives or plasticizers, are finely dispersed or dissolved in a common organic solvent or solvent mixture. In this context it is possible to follow a procedure whereby the individual components are dispersed or dissolved individually or else two or more are dissolved or dispersed together, and only then are all the components combined.

The present invention therefore additionally provides a process for preparing for compositions of the invention by reacting high molecular mass organic material with a colористically effective amount of the pigment dispersion of the invention or compounds of the formulae XXXIVc, XXXIVd or XXXVa or the pigmentary form obtainable from these compounds.

The weight ratio of the pigment dispersions of the invention or of the compounds of the formulae XXXIVc, XXXIVd or XXXVa, or of the pigmentary form obtainable from these compounds to the compositions of the invention is judiciously within the range from 0.001 to 75% by weight, preferably from 0.01 to 50% by weight, based on the overall weight of the composition.

The present invention also provides inks which consist of the compounds of the invention.

Processes for preparing inks for inkjet printing are generally known and are described in a number of documents, such as, for example, in U.S. Pat. No. 5,106,417.

The inks can be prepared, for example, by mixing the pigment dispersions of the invention or the compounds of the formulae XXXIVc, XXXIVd or XXXVa, or the pigmentary form obtainable from these compounds, with polymeric dispersants.

The mixing of the pigment dispersion with the polymeric dispersant takes place in accordance with the generally known methods of mixing, such as stirring or mechanical mixing; it is preferably advisable to use intensive mechanical mixers, such as Ultraturax [sic].

When mixing the pigment dispersions of the invention or the compounds of the formulae XXXIVc, XXXIVd or XXXVa, or the pigmentary form obtainable from these compounds, with polymeric dispersants it is judicious to add a water-dilutable organic solvent.

The compounds of the formulae XXXIVc, XXXIVd or XXXVa are generally converted to the corresponding pigment by generally known methods, such as by thermal, chemical or photolytic methods, for example, prior to, during or after mixing with a polymeric dispersant.

Judiciously, the pigment concentration of the ink lies in general within the range from 0.001 to 75% by weight, preferably from 0.01 to 50% by weight, based on the overall weight of the ink.

Examples of polymeric dispersants are carboxyl-containing polyacrylic resins, such as polymeric methacrylic or crotonic acids, especially those obtained by addition polymerization of acrylic acid or acrylic acid and other acrylic monomers, such as acrylates.

Depending on the field of use, it is possible if desired to admix a small proportion of a water-dilutable organic solvent in from 0.01 to 30% by weight, based on the overall weight of the ink and/or water and and/or bases [sic], so that a pH in the range from 7 to 11 is attained. It may likewise be advantageous, depending on the field of use, to add, for example, preservatives, antifoams, surfactants, light stabilizers and pH regulators to the printing ink of the invention. Examples of suitable pH regulators are inorganic salts, such as lithium hydroxide or lithium carbonate, quaternary ammonium hydroxide or ammonium carbonate. Examples of preservatives and antifoams are, for example, sodium dehydroacetate, 2,2-dimethyl-6-acetoxydioxane or ammonium thioglycolate. It is also possible to employ known agents, described in U.S. Pat. No. 5,106,417, which regulate the viscosity or the surface tension.

Examples of water-dilutable organic solvents are aliphatic $C_1$–$C_4$alcohols, such as methanol, ethanol, n-propanol, isopropanol, n-butanol, tert-butanol, ketones such as acetone methyl ethyl ketone, methyl isobutyl ketone or diacetone alcohol, and also polyols. Cellosolves and carbitols, such as ethylene glycol, diethylene glycol, triethylene glycol, glycerol, propylene glycol [sic], ethylene glycol monom-ethyl or monoethyl ether, propylene glycol methyl ether, dipropylene glycol methyl ether, tripropylene glycol methyl ether, ethylene glycol phenyl ether, propylene glycol phenyl ether, diethylene glycol monomethyl or monoethyl ether, diethylene glycol monobutyl ether, triethylene glycol monomethyl or monoethyl ether, and also N-methyl-2-pyrrolidone, 2-pyrrolidone, N,N'-dimethylformaide [sic] or N,N'-dimethylacetamide.

Working up is carried out in accordance with the customary methods for working up of dispersions by separation techniques, such as sieving or centrifuging of the coarse particles from the resulting dispersion. It has been found advantageous to carry out centrifuging in two stages of different intensity. The first at from 2000 to 4000 rpm for from 10 minutes to 1 hour and then at from 6000 to 10 000 rpm for from 10 minutes to 1 hour.

Following centrifuging or sieving, the dispersion can be used directly as an ink for inkjet printing, for example.

The present invention therefore also provides a process for preparing inks by mixing high molecular mass organic material with a coloristically effective amount of the disperse pigment dispersion of the invention or of the compounds of the formulae XXXIVc, XXXIVd or XXXVa, or of the pigmentary form obtainable from these compounds.

The present invention provides furthermore for the use of a high molecular mass material pigmented in accordance with the invention and comprising the pigment dispersion of the invention, especially the pigment dispersions comprising organic solvents, for producing color filters.

The present invention furthermore provides a process for producing color filters comprising a transparent substrate and applied thereon a red, blue and green layer in any desired sequence in which the red, blue and green layers are produced using in each case an appropriately colored pigment dispersion of the invention, or these layers comprises [sic] an appropriately colored compound XXXIVc, XXXIVd or XXXVa or pigmentary form obtainable from a compound XXXIVc, XXXIVd or XXXVa, or a composition of the invention.

The different-colored layers preferably have patterns which are such that over at least 5% of their area they do not overlap, and with particular preference do not overlap at all.

The production and use of color filter or color-pigmented high molecular mass organic materials are described in Displays 14/2, 1151 (1993), or Journal of the SID 1/3, 341–346 (1993) or at the IDW'95 (paper CF-3, pages 57–60 of the printed version) or Journal of Photopolymer Science and Technology 9/1, 109–120 (1196) and also in Nippon Steel Corp., Application JP 09176511-A, Primary Accession No. 97-399776/37, Pigment dispersion compositions for color resist inks, Asahi Glass Co. Ltd., Application JP 09132740-A, Primary Accession No. 97-328594/30., Ink for inkjetting and substrate with color filter, and Fuji Pigment Co. Ltd., EP 784085-A2, Primary Accession No. 97-352867/33, An ink composition for inkjet application and production of colored filters, and also in Canon KK, Application JP 08327811-A, Primary Accession No. 97-090690/09, where the production of color filters and liquid crystal displays is described.

The color filters can be produced using inks, especially printing inks, which comprise the pigment dispersions of the invention, or, for example, by mixing the pigment dispersion of the invention with chemically, thermally or photolytically structurable high molecular mass materials (resist). The subsequent preparation can take place, for example, in analogy to EP-A- 654 711 by application to a substrate, such as for example an LCD, subsequent photostructuring, and development.

Particular preference for the production of color filters is given to the pigment dispersions of the invention which possess water-free solvents or dispersion media for polymers.

The invention additionally embraces a transparent substrate coated with one red, one blue and one green layer each of an appropriately colored pigment dispersion of the invention or of a compound XXXIVc, XXXIVd or XXXVa or of the pigmentary form obtainable from a compound XXXIVc, XXXIVd or XXXVa or of a composition of the invention comprising pigmented high molecular mass organic material. The sequence of coating is not generally important. Preferably, the different-colored layers have patterns which are such that over at least 5% of their area they do not overlap, and with particular preference do not overlay at all.

The present invention additionally embraces color filters comprising a transparent substrate and, applied thereon, a red, blue and green layer each obtainable from a correspondingly colored pigment dispersion of the invention or a compound XXXIVc, XXXIVd or XXXVa or comprising the pigmentary form obtainable from a compound XXXIVc, XXXIVd or XXXVa or a composition of the invention.

The present invention provides, moreover, toners comprising a pigment dispersion of the invention or a compound XXXIVc, XXXIVd or XXXVa or the pigmentary form obtainable from a compound XXXIVc, XXXIVd or XXXVa or a composition of the invention comprising pigmented high molecular mass organic material in a coloristically effective amount.

The present invention additionally provides processes for preparing toners by mixing a high molecular mass organic material with a coloristically effective amount of the disperse pigment dispersion of the invention or of the compound of the formulae XXXIVc, XXXIVd or XXXVa or of the pigmentary form pigmentary form [sic] obtainable from these compounds, or a composition of the invention, comprising pigmented high molecular mass material.

In a particular embodiment of the process of the invention, toners, coating materials, inks or colored plastics are prepared by carrying out mixing in masterbatches using roll mills or mixing or milling apparatus.

The present invention additionally provides colorants comprising a pigment dispersion of the invention or a compound XXXIVc, XXXIVd or XXXVa or the pigmentary form obtainable from a compound of XXXIVc, XXXIVd or XXXVa, or a composition of the invention, comprising pigmented high molecular mass organic material in a coloristically effective amount.

The present invention provides, furthermore, colored plastics or polymeric ink particles comprising a pigment dispersion of the invention or a compound XXXIVc, XXXIVd or XXXVa or the pigmentary form obtainable from a compound XXXIVc, XXXIVd or XXXVa, or a composition of the invention, comprising pigmented high molecular mass organic material in a coloristically effective amount.

The present invention additionally provides non-impact-printing material comprising a pigment dispersion of the invention or a compound XXXIVc, XXXIVd or XXXVa or the pigmentary form obtainable from a compound XXXIVc, XXXIVd or XXXVa, or a composition of the invention, comprising pigmented high molecular mass organic material in a coloristically effective amount.

The present invention also provides a process for preparing non-impact-printing material by mixing a high molecular mass organic material with a coloristically effective amount of the disperse pigment dispersion of the invention or of the compound of the formulae XXXIVc, XXXIVd or XXXVa or of the pigmentary form pigmentary form [sic] obtainable from these compounds, or a composition of the invention, comprising pigmented high molecular mass material.

A coloristically effective amount of the disperse pigment dispersion of the invention or of the compound of the formulae XXXIVc, XXXIVd or XXXVa, or of the pigmentary form pigmentary form [sic] obtainable from these compounds, or a composition of the invention, comprising pigmented high molecular mass material, generally denotes from 0.0001 to 99.99% by weight, preferably from 0.001 to 50% by weight and, with particular preference, from 0.01 to 50% by weight, based on the overall weight of the material pigmented therewith.

It has now been found that with the process of the invention, very fine pigment dispersions are prepared without the high energy, time and apparatus requirement of milling and evaporation techniques. The pigment dispersions are notable for high stability and transparency and possess outstanding coloristic and performance properties. They are particularly suitable for the preparation of inks and production of color filters which have high color strengths, brightness and transparency.

The examples which follow illustrate the invention.

EXAMPLE 1

Preparing Carboxyl-Containing Copolymers

In a flask with a hermetically sealed stirrer mechanism, 8.5 g of vinylbenzoic acid are dissolved in 50 g of dioxane. A mixture of 20 g of vinyltoluene and 40 g of styrene is added. In this mixture, 0.75 g of the initiator 4,4'-azobis(4-cyanopentanoic acid) is dissolved. 500 mg of dodecyl mercaptan are added. The mixture is freed from oxygen by passing in nitrogen and is subsequently held at 70° C. for 6 hours. The viscous solution is poured into 1 liter of cold methanol in order to precipitate the product. After decanting the methanol, the polymer is washed with a further portion of methanol. Finally, the polymer is dried in a desiccator over potassium hydroxide. The polymer has a molar mass (number average) of 16 000, determined by gel permeation chromatography. The ratio Mw/Mn (mass average/number average) is 1.94.

EXAMPLE 2

Preparing a Dispersion of the Invention 200 mg of the latent pigment N,N'-bis-tert-butoxycarbonyl-1,4-diketo-3-phenyl-6-(4-tert-butylphenyl) pyrrolo[3,4-c]pyrrole, obtainable by the technique described in Example 1 of U.S. Pat. No. 5,484,943, are dissolved in 10 ml of 1,4-dioxane, and 1 g of octadecene-maleic anhydride copolymer (MW 50 000, from Scientific Polymer Products Inc.) is dissolved in 20 ml of dioxane. The latent pigment solution is added to the polymer solution, and the yellow mixed solution formed is evaporated to dryness on a rotary evaporator under reduced pressure and at a maximum temperature of 60° C. The resulting mixture of solids is dried in vacuo at 60° C. for 14 hours and then subjected to a temperature of 140° C. in a preheated oven for 2 hours. Following this heat treatment, the color of the mixture of solids changes from yellow to red. The mixture of solids is cooled to room temperature and treated with 20 ml of dioxane. The polymer is dissolved by ultrasound treatment, while the generated pigment is dispersed. 700 microliters of morpholine and 20 ml of water are added in succession to the resulting dispersion. After mixing, dioxane is distilled off on a rotary evaporate under reduced pressure and the red dispersion is concentrated to 20.7 g. The resulting dispersion is homogeneous and transparent. It has a viscosity of 2.16 mPas at 25° C. After several days, no tendency to precipitate is observed.

EXAMPLE 3

Preparing a Dispersion of the Invention 700 mg of the latent pigment N,N'-bis-tert-butoxycarbonyl-1,4-diketo-3,6-bis-p-chlorophenylpyrrolo[3,4-c]pyrrole, prepared as in U.S. Pat. No. 5,484,943, are dissolved in 15 ml of 1,4-dioxane, and 1.5 g of styrene-vinyltoluene-vinylbenzoic acid copolymer (prepared as in Example 1) is dissolved in 20 ml of dioxane. The latent pigment solution is added to the polymer solution, and the yellow mixed solution formed is evaporated to dryness on a rotary evaporator under reduced pressure (<1 mPa) and at a maximum temperature of 60° C. for one hour. The mixture of solids is subjected to a temperature of 140° C. in a preheated oven for one hour. Following this heat treatment, the color of the mixture of solids changes from yellow to red. The mixture of solids is cooled to room temperature and treated with 20 ml of dioxane. The polymer is dissolved by ultrasound treatment, while the generated pigment is dispersed. 2 ml of morpholine and 30 ml of water are added in succession to the resulting dispersion. After mixing, dioxane is distilled off on a rotary evaporator under reduced pressure and the red dispersion is concentrated to 20 g. The resulting dispersion is homogeneous and transparent. It has a viscosity of 6 mPas at 25° C. After several days, no tendency to precipitate is observed.

EXAMPLE 4

Preparing a Dispersion of the Invention

The latent pigment of the formula

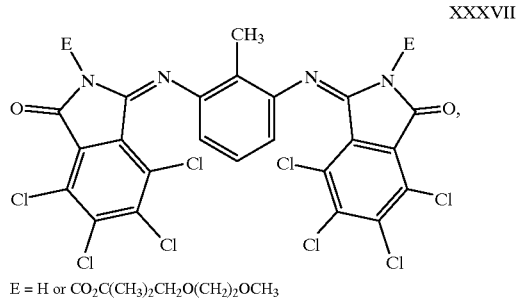

XXXVII

E = H or $CO_2C(CH_3)_2CH_2O(CH_2)_2OCH_3$ is prepared in analogy to known techniques. The precursor compound of the formula

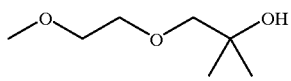

is obtainable in analogy to U.S. Pat. No. 2,886,600. By known techniques (Houben Weyl Volume 8, p. 101 ff) this product is reacted with phosgene to give the product of the formula

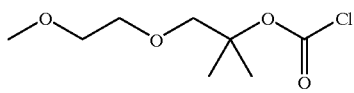

which is then reacted further with a pigment of the formula XXXVII in which E has the meaning of H in the presence of a deprotonation catalyst. The compound of the formula XXXVII is obtained, in which E has the meaning of $CO_2C(CH_3)_2CH_2O(CH_2)_2OCH_3$.

500 mg of the latent pigment of the formula XXXVII are dissolved in 15 ml of 1,4-dioxane and this solution is mixed with a solution of 1.5 g of the copolymer described in Example 1 in 20 ml of dioxane. The clear yellow solution is evaporated to dryness on a rotary vacuum evaporator and the residue is subsequently dried further in a drying cabinet at about 200 torr and 60° C. for 15 hours. The resulting product is subsequently heated at 140° C. for 2 hours in a circulating-air drying cabinet. After cooling, 20 ml of dioxane are added, and by means of ultrasound treatment the polymer is disrupted and at the same time the regenerated pigment is dispersed. 2 ml of morpholine and 30 ml of water are added to this dispersion. The dioxane is subsequently evaporated off and the dispersion is concentrated to 20 g, corresponding to a pigment concentration of 1.63 per cent by weight. The resulting bright yellow dispersion has a viscosity of 3.1 mPas at 25° C. A sample is diluted 25-fold with water and the transmission spectrum is measured in a 1 mm cell. At the maximum (light wavelength 420 nm) the absorption is 2.09 while at 600 nm it is only 0.1, which points to fine particles with good transparency. In addition, electron micrographs show that all particle dimensions are below 0.5 micrometers.

EXAMPLE 5

Preparing the Latent Pigment of the Formula

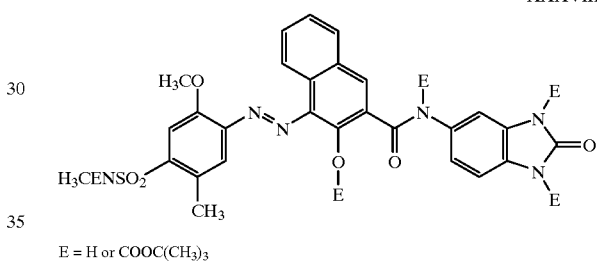

XXXVIII

E = H or $COOC(CH_3)_3$ 1.53 g (12.5 mmol) of dimethylaminopyridine and 27.25 g (125 mmol) of di-tert-butyl dicarbonate are added to a suspension of 10 g (17.8 mmol) of XXXVIII, in which E has the meaning of H, in 250 ml of tetrahydrofuran. After overnight stirring at room temperature the reaction mixture is filtered over $MgSO_4$ and the filtrate is concentrated. The concentrate is diluted with hexane an mixed thoroughly and the precipitated crude product is filtered off, washed with hexane and dried. Filtration over 500 g of silica gel and elution of the product with methylene chloride/ethyl acetate (29:1) give 12.6 g (yield of 67% of theory) of pure product, XXXVIII, in which E has the meaning of $COOC(CH_3)_3$, as a claret red powder.

| Microanalysis: | | | | |
|---|---|---|---|---|
| expected: | % C 58.46, | % H 6.00, | % N 8.36, | % S 3.12 |
| found: | % C 58.39, | % H 6.15, | % N 8.01, | % S 3.06 |

Thermogravimetric analysis of the decomposition shows a midpoint temperature of 164.0° C.; $\Delta M_{theoretical}$=46.6%, $\Delta M_{experimental}$=43.5%.

EXAMPLE 6

Preparing a Dispersion of the Invention 500 mg of the latent pigment of the formula XXXVIII, which is prepared as described in Example 5, are dissolved in 15 ml of 1,4-dioxane and that solution is mixed with a solution of 1.5 g of a copolymer of 75% styrene and 25% maleic anhydride (acid number 275, from Scientific Polymer Products, Inc.) in 20 ml of dioxane. The clear solution is evaporated to dryness on a vacuum rotary evaporator and the residue is subsequently dried further in a drying cabinet at 200 torr and 60° C. for 15 hours. The resulting product is then heated at 140° C. in a circulating-air drying cabinet for 2 hours. After cooling, 20 ml of dioxane are added and the polymer is disrupted by treatment in an ultrasound bath, the regenerated pigment being dispersed at the same time. 1.5 ml of morpholine and 30 ml of water are added to the dispersion. The dioxane is subsequently evaporated off and the dispersion is concentrated to 20 g, corresponding to a pigment concentration of 1.33 per cent by weight based on the overall weight of the dispersion. The resulting blue-red dispersion has a viscosity of 4.5 mPas at 25° C. A sample is diluted 40-fold with water and the transmission spectrum is measured in a 1 mm cell. At the maximum (520 nm) the absorption is 1.42, while at 660 nm it is only 0.1, which points to fine particles with good transparency. In addition, electron micrographs show that all particle dimensions are below 0.5 micrometers.

EXAMPLE 7

Preparing the Latent Pigment of the Formula

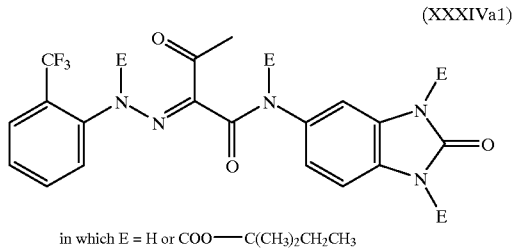

(XXXIVa1)

in which E = H or COO—C(CH3)2CH2CH3

1.75 g (14.4 mmol) of dimethylaminopyridine and 35.4 g (143 mmol) of di-tert-amyl dicarbonate are added to a suspension of 10 g (24.7 mmol) of the above pigment, in which E has the meaning of H, in 80 ml of tetrahydrofuran. After overnight stirring at room temperature the reaction mixture is filtered over silica gel and the filtrate is concentrated. The concentrate is diluted with methanol/water and filtered over kieselguhr, and the precipitated crude product is filtered, then washed over silica gel with methylene chloride/ethyl acetate and subsequently dried. This gives (in a yield of 49% of theory) a pure product, in which E has the meaning of COOC(CH$_3$)$_2$CH$_2$CH$_3$ as a red powder.

| Microanalysis: | | | |
|---|---|---|---|
| expected: | % C 58.53 | % 6.31, | % N 8.13, |
| found: | % C 58.8, | % H 6.3, | % N 8.63, |

Thermogravimetric analysis of the decomposition shows a midpoint temperature of 152.9° C.; $\Delta M_{theoretical}$=49.9%, $\Delta M_{experimental}$=49.5%.

EXAMPLE 8

Preparing a Dispersion of the Invention 800 mg of the latent pigment of the formula XXXIVa1, which is prepared as described in Example 7, are dissolved in 15 ml of 1,4-dioxane and that solution is mixed with a solution consisting of 1.5 g of the copolymer described in Example 1 and 15 ml of dioxane. The clear solution is evaporated to dryness on a vacuum rotary evaporator and the residue is subsequently dried further in a drying cabinet at about 200 torr and 60° C. for 15 hours. The resulting product is then heated at 140° C. in a circulating-air drying cabinet for 2 hours. After cooling, 20 ml of dioxane are added and the polymer is disrupted by ultrasound treatment, the regenerated pigment being dispersed at the same time. 1.5 ml of morpholine and 25 ml of water are added to the dispersion. The dioxane is subsequently evaporated off and the dispersion is concentrated to 20 g, corresponding to a pigment concentration of 1.88 per cent by weight based on the overall weight of the dispersion. The resulting bright yellow dispersion has a viscosity of 3.8 mPas at 25° C. A sample is diluted 40-fold with water and the transmission spectrum is measured in a 1 mm cell. At the maximum (light wavelength 346 nm) the absorption is 1.86, while at 600 nm it is only 0.05, which points to fine particles with good transparency. In addition, transmission electron micrographs show that all particle dimensions are below 0.1 micrometers.

The dispersion is stable to flocculation and sedimentation.

EXAMPLE 9

Preparing the Latent Pigment of the Formula

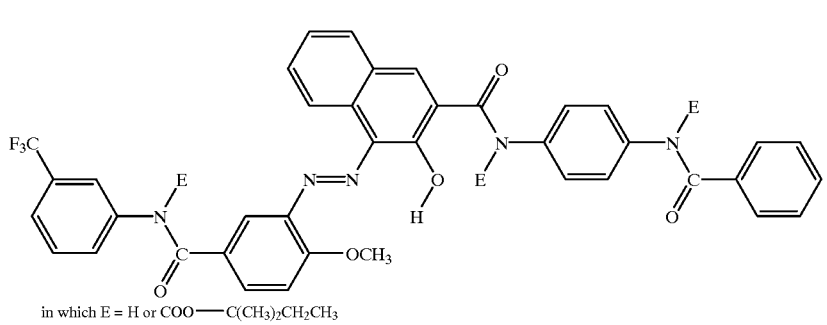

(XXXVa1)

in which E = H or COO—C(CH3)2CH2CH3

4.4 g (36 mmol) of dimethylaminopyridine and 88.7 g (0.36 mmol) of di-tert-amyl dicarbonate are added to a suspension of 50 g (71.1 mmol) of the above pigment, in which E has the meaning of H, in 1 l of tetrahydrofuran. After overnight stirring at room temperature the reaction mixture is filtered over silica gel and the filtrate is concentrated. The concentrate is diluted with hexane and mixed thoroughly and the precipitated crude produce is filtered, washed with hexane and then dried. This gives (in a yield of 31.9% of theory) a pure product, XXXVa1, in which E has the meaning of $COOC(CH_3)_2CH_2CH_3$, as a red powder.

| Microanalysis: | | | |
|---|---|---|---|
| expected: | % C 65.48, | % H 5.70, | % N 6.68, |
| found: | % C 65.45, | % H 5.59, | % N 6.69. |

Thermogravimetric analysis of the decomposition shows a midpoint temperature of 160.0° C.; $\Delta M_{theoretical}$=32.7%, $\Delta M_{experimental}$=31.9%.

EXAMPLE 10

1.33 g of the latent pigment XXXVa1 prepared in accordance with Example 9, as a solution in 40 ml of dioxane, are mixed with 10 g of a solution which comprises 40% by weight of a copolymer of benzyl methacrylate and acrylic acid, dissolved in methoxypropyl acetate. This copolymer is obtainable under the designation FF187 from Fuji Photo Film (Japan). The mixture is evaporated to dryness under reduced pressure at 60° C. and the residue is subsequently heated at 150° C. for 2 hours. After cooling, the solid is redispersed in 30 ml of dioxane, and then 6.5 g of N,N'-dimethylaminoethanol and 40 ml of water are added and the homogenous dispersion is concentrated on a vacuum rotary evaporator to 33 g. This gives a flocculation-stable dispersion having a pigment content of 2.7% by weight based on the overall mass. A sample of the dispersion is diluted 100-fold with water and the transmission spectrum is measured in a 1 mm cell. At the maximum (light wavelength 572 nm) the absorption is 1.21, while at 650 nm it is less than 0.1, which points to fine particles with good transparency.

The examples which follow illustrate the uses of the dispersions of the invention for preparing inks for inkjet printers.

EXAMPLE 11

2.8 g of the pigment dispersion of Example 1 are mixed with 0.7 g of a 2% (per cent by weight) solution of a surface-active substance (Fluorad FC-171 from 3M Inc.) dissolved in diethylene glycol. The resulting ink is tested in a "QuietJet" (Hewlett-Packard) thermal inkjet printer which is fitted with a plastic device provided to accommodate the ink. A clear, sharp print quality is obtained, as is a surface coverage at a peak optical density of 0.5 (this value is measured with a spectrometer in reflection mode, which is subtracted from the reflection of the paper).

The ink shows no tendency to bleed or penetrate through customary commercial copier paper.

EXAMPLE 12

10 g of the pigment dispersion of Example 3 are mixed with 0.8 g of a 2% (per cent by weight) solution of a surface-active substance (Fluorad FC-171 from 3M Inc.) and diethylene glycol and with 1.2 g of diethylene glycol, 0.5 g of 2-propanol, 0.2 g of morpholine and 0.2 g of butyl sulfoxide. The resulting ink is tested in a "QuietJet" (Hewlett-Packard) thermal inkjet printer which is fitted with a plastic device provided to accommodate the ink. A clear, sharp print quality is obtained, as is a surface coverage with a maximum optical density of 1.09 (this value is measured with a spectrometer in reflection mode, which is subtracted from the reflection of the paper).

The ink shows no tendency to bleed or penetrate through customary commercial copier paper.

EXAMPLE 13

10 g of the dispersion according to Example 4, 1 g of a 2% solution of Fluorad FC-171 (3M Inc.), 1 g of diethylene glycol, 0.3 g of 2-propanol and 80 mg of butyl sulfoxide are mixed without using high shear forces or separation methods. Using this ink, sample strips are printed out with a Hewlett-Packard "QuietJet" thermal inkjet printer. The optical reflection density of the colored area as measured by densitometry (Macbeth Model 924) is 0.69 for the blue channel. Even on prolonged printing, no clogging of the inkjet nozzle is observed. Three months following the preparation of the ink according to Example 7, it is still free from flocculation.

What is claimed is:

1. Process for preparing pigment dispersions, characterized by c1) preparing a mixture comprising a latent pigment, a polymer and a solvent, c2) subsequently removing the solvent from the resulting mixture, and c3) then subjecting the solvent-free mixture A to thermal, chemical or photolytic treatment, and c4) then adding a solvent to the treated mixture.

2. Process for preparing pigment dispersions, characterized by d1) preparing a mixture B comprising a latent pigment, a polymer and solvent, and d2) subsequently removing some of the solvent from the resulting mixture, and d3) then subjecting the resulting mixture to thermal, chemical or photolytic treatment.

* * * * *